United States Patent
McGinnis

(10) Patent No.: US 6,193,544 B1
(45) Date of Patent: Feb. 27, 2001

(54) FLEXIBLE CIRCUIT SERVICE CONNECTOR

(75) Inventor: Michael S. McGinnis, Irvine, CA (US)

(73) Assignee: JAE Electronics, Inc., Irvine, CA (US)

( * ) Notice: Subject to any disclaimer, the term of this patent is extended or adjusted under 35 U.S.C. 154(b) by 0 days.

(21) Appl. No.: 09/433,846

(22) Filed: Nov. 4, 1999

(51) Int. Cl.⁷ .................................................. H01R 12/24
(52) U.S. Cl. .................... 439/492; 439/499; 174/117 FF; 29/847
(58) Field of Search ..................................... 439/492, 494, 439/495, 496, 499, 67; 29/847; 174/117 FF, 250, 254

(56) References Cited

U.S. PATENT DOCUMENTS

| | | | |
|---|---|---|---|
| 3,188,601 | * 6/1965 | De Tar | 439/492 |
| 3,707,696 | * 12/1972 | Carter | 439/492 |
| 3,950,070 | * 4/1976 | Groft et al. | 439/492 |
| 3,989,336 | 11/1976 | Rizzio, Jr. et al. | |
| 4,092,057 | 5/1978 | Walton | |
| 4,248,491 | 2/1981 | Mouissie | |
| 4,576,427 | 3/1986 | Verbruggen | |
| 4,621,305 | 11/1986 | Daum | |
| 4,639,057 | 1/1987 | Daum | |
| 4,743,080 | * 5/1988 | Siraty | 439/492 |
| 4,784,615 | 11/1988 | Teng-Hong | |
| 5,009,607 | 4/1991 | Gordon et al. | |
| 5,240,420 | 8/1993 | Roberts | |
| 5,342,203 | 8/1994 | Perretta et al. | |
| 5,482,473 | 1/1996 | Lord et al. | |
| 5,667,389 | 9/1997 | Kidd et al. | |
| 5,871,362 | 2/1999 | Campbell et al. | |
| 5,928,027 | 7/1999 | Kunishi | |
| 5,954,536 | 9/1999 | Fuerst et al. | |
| 6,109,928 | * 8/2000 | Morris et al. | 439/67 |

* cited by examiner

Primary Examiner—Paula Bradley
Assistant Examiner—Tho D. Ta
(74) Attorney, Agent, or Firm—Glenn R. Smith

(57) ABSTRACT

A flexible circuit can be cut and spliced to replace a device connected to a removable portion of the circuit. The cut and splice procedure is facilitated by three components, including a service segment integrated into the flexible circuit, a slider assembly that attaches to the flexible circuit within the service segment and a contact assembly that connects to the slider assembly. The service segment is configured with a number of contact pads protected by a detachable insulation layer, which is removed prior to attaching the slider assembly. The flexible circuit can be cut anywhere within a cut zone portion of the service segment in order to detach the removable portion. The slider assembly snaps onto the service segment and provides a convenient straightedge guide within the cut zone. The slider assembly also provides rigid support to the severed end of the remaining flexible circuit, forming a splice plug in conjunction with the contact pads. The contact assembly has a socket that houses contacts corresponding to the contact pads. These contacts are soldered at one end to a replacement flexible circuit. The slider assembly attaches to the contact assembly with the splice plug inserted into the socket to complete the splice. The splice is secured by a locking lever on the contact assembly that retains the slider assembly and a tab on the contact assembly that insures the slider assembly remains attached to the service segment.

20 Claims, 23 Drawing Sheets

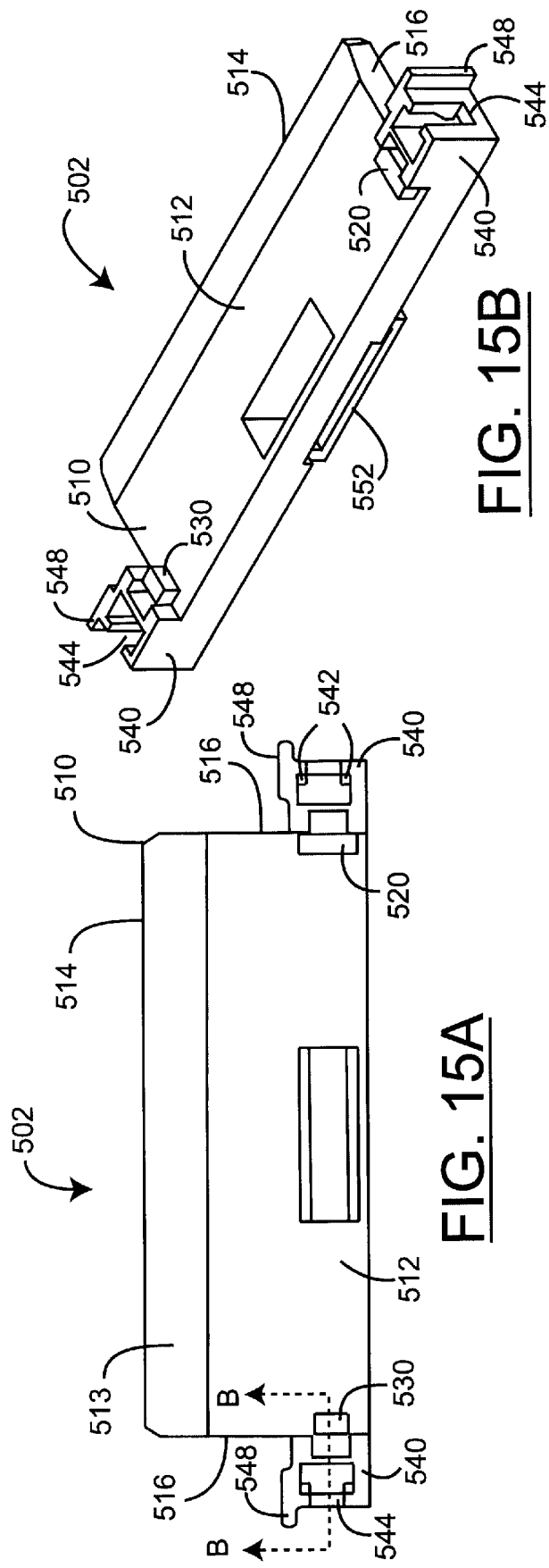
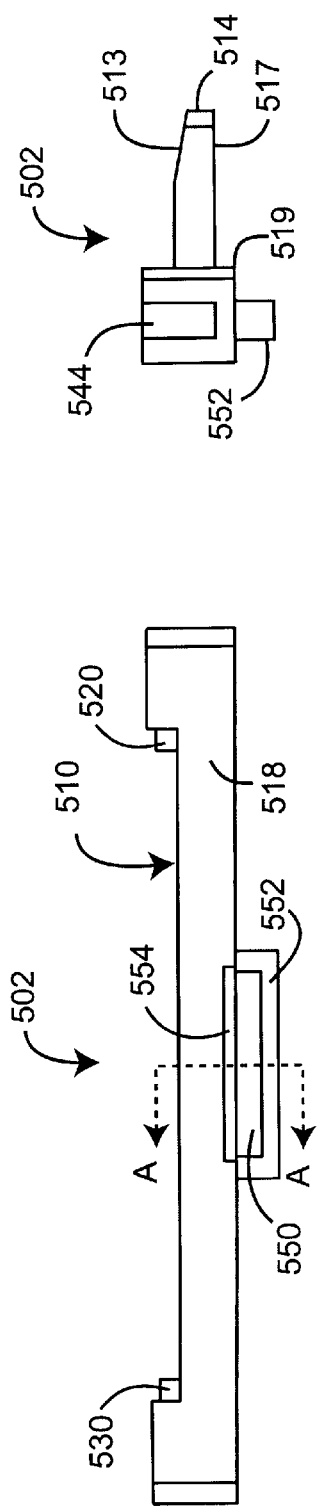
FIG. 15B
FIG. 15D
FIG. 15A
FIG. 15C

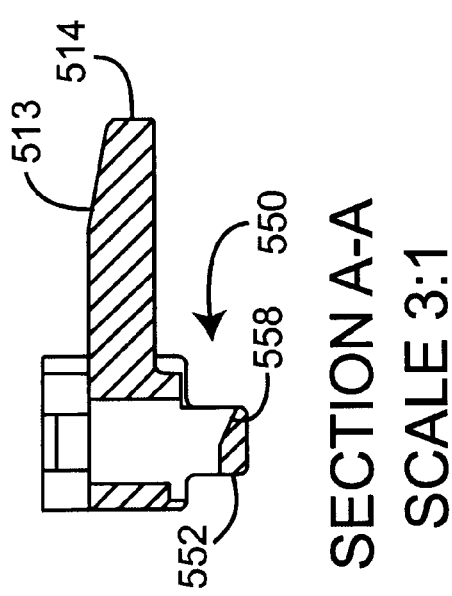
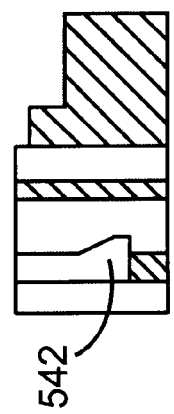
FIG. 15E  SECTION A-A SCALE 3:1
FIG. 15F  SECTION B-B SCALE 3:1

SECTION B-B

SECTION A-A

DETAIL C

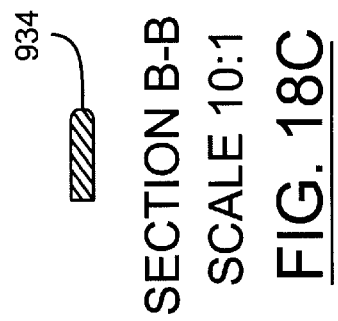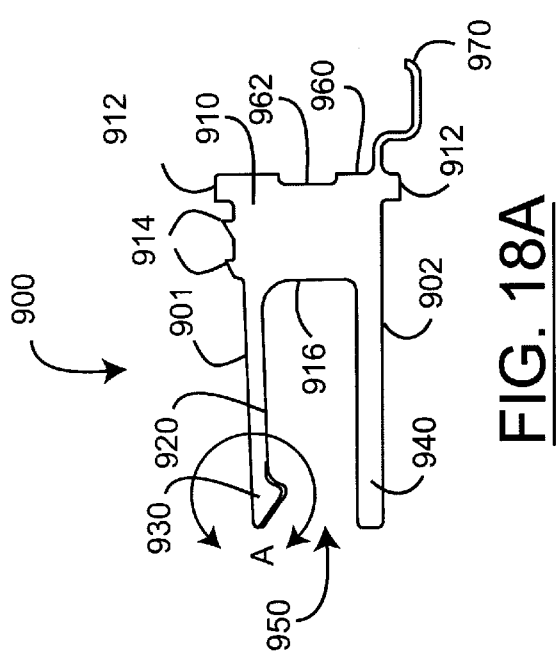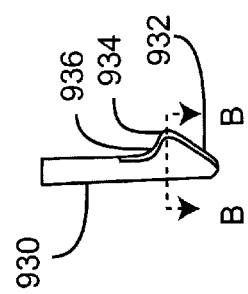

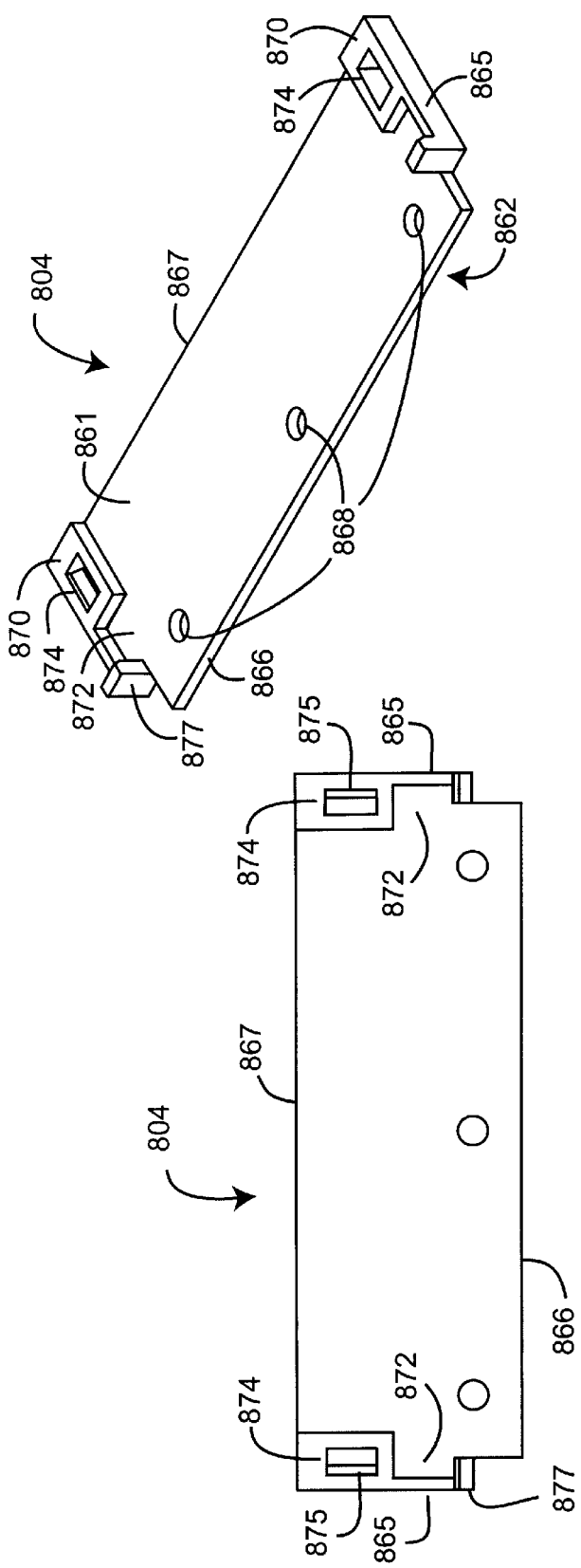
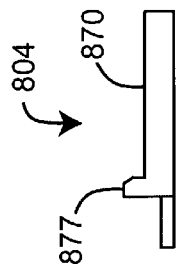
FIG. 19B
FIG. 19D
FIG. 19A
FIG. 19C

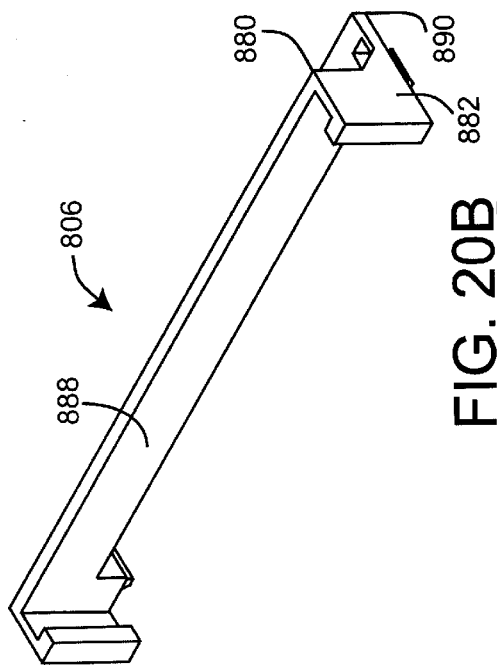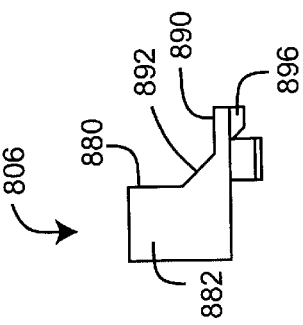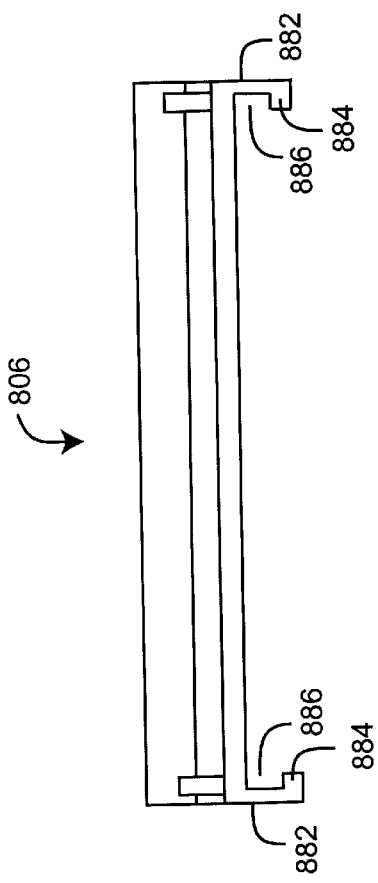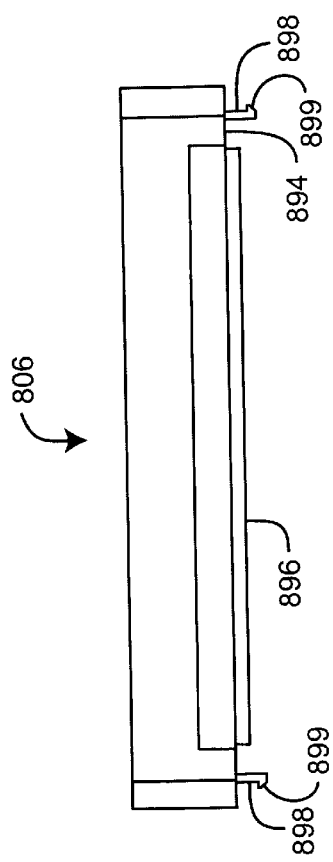

FLEXIBLE CIRCUIT SERVICE CONNECTOR

BACKGROUND OF THE INVENTION

A flexible or "flex" circuit is a laminate of flexible polyimide film, such as KAPTON®, and a thin sheet of copper etched to produce a pattern of traces and contact pads. An overlying insulation layer is typically used to insulate the copper and environmentally seal the circuit. Flexible circuits include flexible flat cable (FFC) and flexible printed circuits (FPC). The FFC was originally designed as a compact and light-weight interconnect to replace bulky wire harnesses. With the advent of surface-mount electronic components, FPC technology evolved, creating a thin, flexible replacement for conventional rigid printed circuit boards. Flexible circuits provide multiple benefits. A flexible circuit can bend, fold, twist, and be rolled, providing almost unlimited freedom for locating parts and subassemblies. Further, the polyimide film can survive vibration and shock that would damage a rigid board. As a result, design engineers can utilize flexible circuits to solve space, configuration and weight problems that cannot be addressed with conventional wiring or rigid circuit technologies.

SUMMARY OF THE INVENTION

FIG. 1 schematically depicts a prior art electrical or electronic system 100 utilizing a conventional FFC 102 to interconnect device A 104 and device B 106 to a backplane 108. A failure of device A 104, device B 106 or the backplane 108 would require replacement of the entire system 100. Unlike wiring harnesses, a conventional FFC cannot be cut and spliced in order to replace an interconnected circuit, module or device that has failed. As a result, complete systems must be replaced when any attached component fails, increasing maintenance costs. Alternatively, a connector must be used at each circuit, module or device interface, increasing production costs and reducing reliability. Neither of these alternatives are desirable.

The present invention provides an apparatus and method to cut and splice a flexible circuit, combining the servicing advantages of a wiring harness without the associated weight and bulk disadvantages. The flexible circuit service connector according to the present invention provides one or more service segments integrated into a flexible circuit. The service segments can be cut and spliced to remove and replace a flexible circuit portion that is connected to a faulty component, module or device. The service segment functions in conjunction with a slider assembly and contact assembly. The slider assembly attaches to the service segment to create a splice plug from the severed end of the cut flexible circuit. The contact assembly attaches to a replacement circuit and has a socket that mates with the splice plug to complete a splice.

One aspect of the flexible circuit service connector is a cut zone portion of the service segment. Advantageously, any cut within the cut zone boundaries, whether straight, crooked or curved, will allow a successful splice. Therefore, it is not critical how the flexible circuit is severed or the tool used to perform the cut. To facilitate detaching a portion of the flexible circuit, however, a portion of the attached slider assembly functions as a straightedge cutting guide situated within the cut zone. An advantageous aspect of the slider assembly is that it requires no special installation tools to attach it to the service segment. The slider assembly simply snaps onto a notched portion of the service segment. The slider assembly is also removable and reusable. An advantageous aspect of the contact assembly is that it removably locks to the slider assembly, increasing splice reliability yet allowing the splice to be disconnected. Further, retaining tabs on the contact assembly secure together the snap-on portions of the slider assembly when the slider assembly is locked to the contact assembly, also insuring a reliable splice.

Another aspect of the present invention is a service connector utilizing a flexible circuit having a thin layer of conductive material. The service connector includes a service segment portion of the flexible circuit. Within the service segment, the flexible circuit conductive material is patterned as a plurality of contact pads. The service segment divides the flexible circuit into a removable portion and a remaining portion. The flexible circuit can be severed within the service segment in order to detach the removable portion. This creates a severed end terminating the remaining portion of the flexible circuit. At least a portion of each of the contact pads is located on the remaining portion near the severed end. A slider attaches to the service segment to support the remaining portion severed end and the associated contact pads. An insulator provides a socket that is configured for insertion of the slider. A plurality of contacts are installed within the socket. Each of the contacts connect to a replacement circuit and, when the slider is inserted into the socket, also to a corresponding one of the contact pads.

Yet another aspect of the present invention is a method of cutting off a removable portion of a flexible circuit and splicing a replacement circuit to a remaining portion of the flexible circuit. This cut and splice method comprises the step of providing a service segment between the removable portion and the remaining portion of the flexible circuit, with the remaining portion having a plurality of contact pads. Another step is attaching a support to the remaining portion within the service segment. Yet another step is severing the flexible circuit within the service segment so as to detach the removable portion from the remaining portion. Further steps are installing a plurality of contacts within an insulator and electrically connecting the plurality of contacts to the replacement circuit. One other step is mating the support to the insulator so as to provide electrical communication between each of the contacts and a corresponding one of the contact pads.

A further aspect of the present invention is a service connector for severing a flexible circuit to detach a removable portion of the flexible circuit from a remaining portion of the flexible circuit and for creating a splice between a replacement circuit and a severed end of the remaining portion. The service connector has a service segment means for providing a plurality of contact pads on the remaining portion. The assembly also has a splice plug means for supporting the severed end and the contact pads, where the splice plug means is attachable to the service segment means. Further elements of the service connector are a socket means for engaging the splice plug means and a contact means installed within the socket means for providing electrical connection to the contact pads when the splice plug means engages the socket means. The contact means is connectable to the replacement circuit so as to provide electrical communications between the replacement circuit and the remaining portion when the splice plug engages the socket means, thereby completing the splice.

BRIEF DESCRIPTION OF THE DRAWINGS

FIGS. 15A–F are top, perspective, back, side and sectional views of the slider;

FIGS. 18A–C are top, detail and sectional views of a contact;

FIGS. 19A–D are top, perspective, front and side views of a strain relief bottom; and FIGS. 20A–D are top, perspective, front and side views of a strain relief top.

DETAILED DESCRIPTION OF THE PREFERRED EMBODIMENTS

Overview

Figure 1:
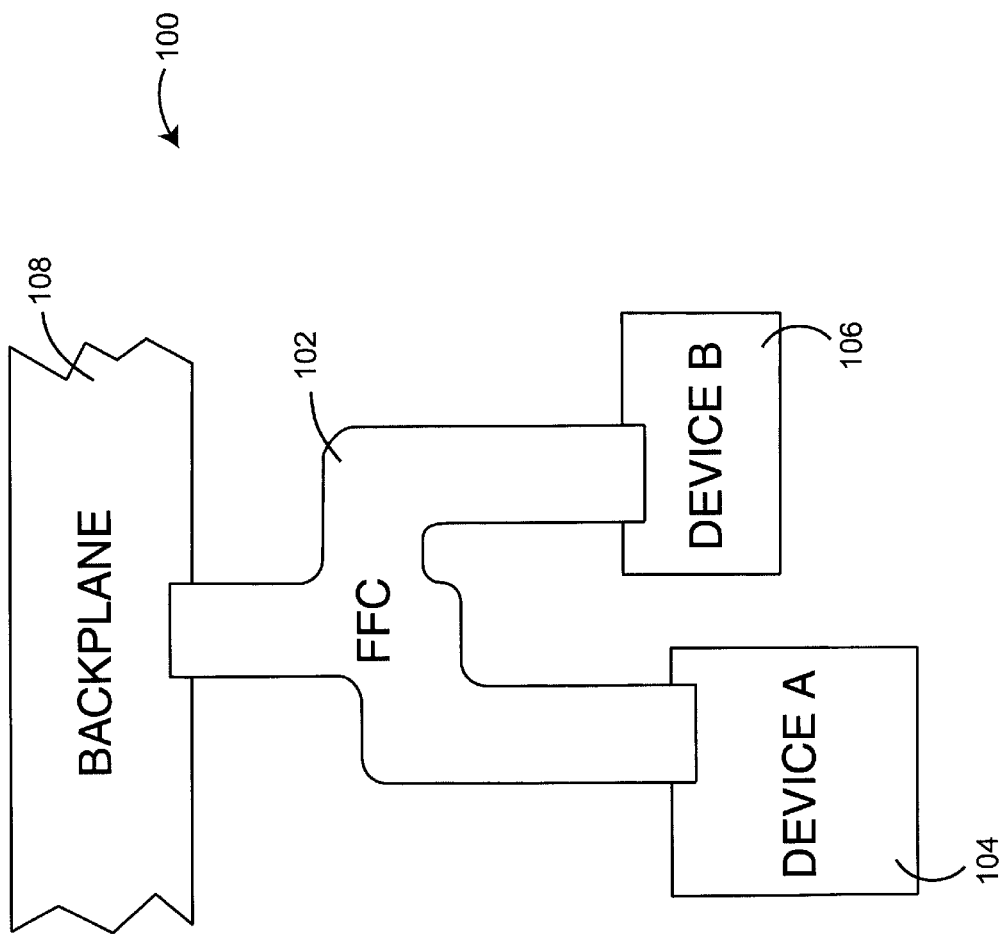
FIG. 1 is a schematic of a prior art flexible flat cable (FFC) interconnecting multiple devices.
Figure 2:
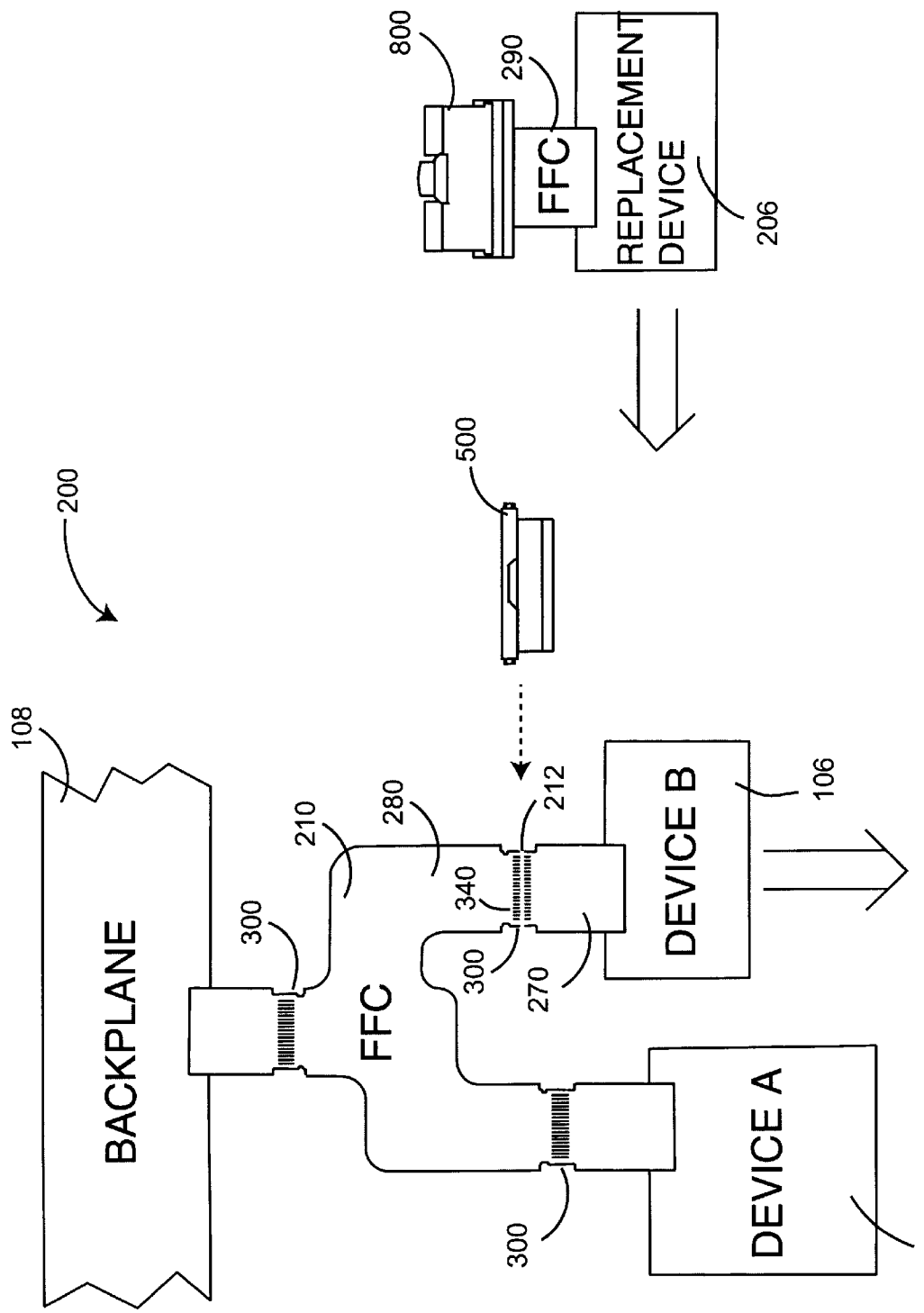
FIG. 2 is a schematic of a FFC interconnect incorporating a flexible circuit service connector according to the present invention.

FIG. 2 illustrates one embodiment of a flexible circuit service connector having a service segment 300, a slider assembly 500 and a contact assembly 800 according to the present invention. Unlike a conventional system 100 (FIG. 1), the electrical or electronic system 200 utilizes an FFC interconnect 210 having a service segment 300 incorporated near each device 104, 106. Advantageously, this allows a failed device to be cut 212 from the system 200 and a replacement device 206 to be spliced into the system 200 without replacing the FFC interconnect 210 and all of the attached devices.

As an example, FIG. 2 assumes a failure of device B 106. The slider assembly 500 is attached to the service segment 300 nearest the failed device 106. The FFC 210 is cut 212 within that particular service segment 300 to detach a removable FFC portion 270 from a remaining FFC portion 280, allowing device B 106 to be removed. The contact assembly 800 is attached to a replacement FFC 290, which connects to a replacement device 206. Contact pads 340 at the severed end of the remaining FFC portion 280 and the attached slider assembly 500 are plugged into the contact assembly 800, forming a splice between the remaining FFC portion 280 and the replacement FFC 290. This electrically connects the replacement device 206 to the system 200, completing its repair.

The described flexible circuit service connector thus achieves the cut and splice convenience of a wire harness assembly and the compactness, flexibility and weight advantages of FFC. Although described above with respect to a FFC, the flexible circuit service connector is also applicable to the removal, repair or replacement of portions of a flexible printed circuit (FPC) having surface-mounted or through-hole components, a semi-rigid circuit, a circuit with FFCs or FPCs combined with rigid circuit boards, or any similar technology, referred herein generally as "flexible circuits."

The Service Segment

Figure 3:
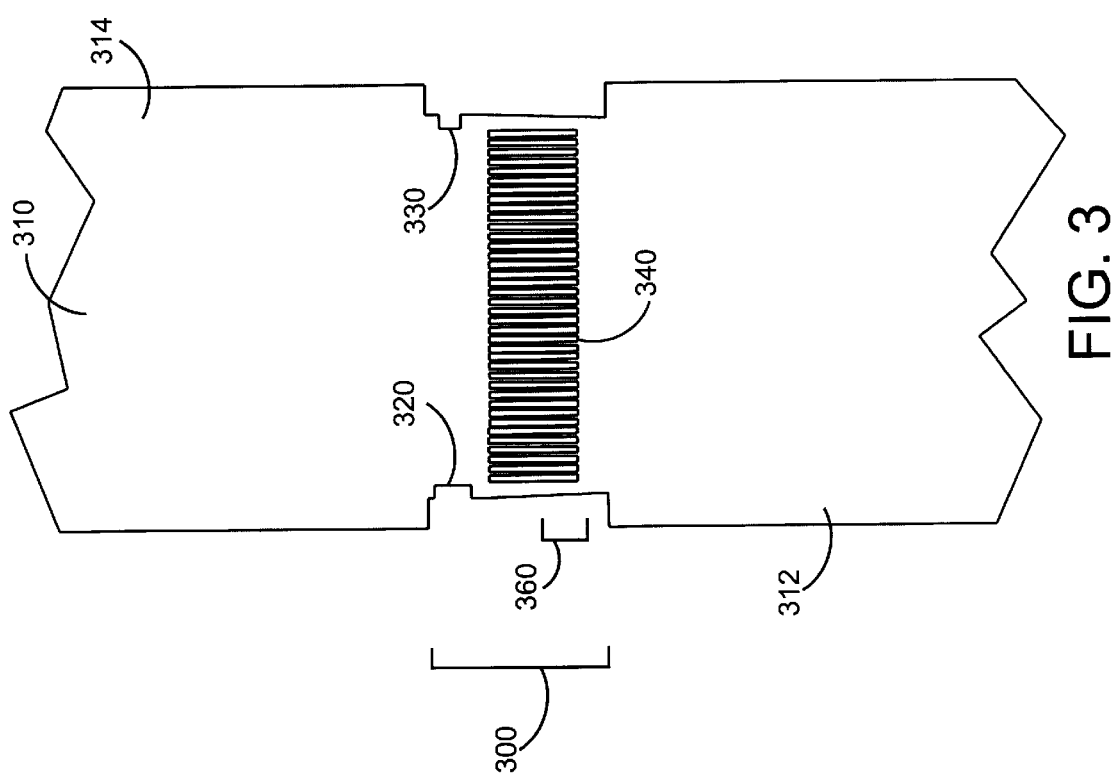
FIG. 3 is an expanded top view of a service segment.

FIG. 3 illustrates a service segment 300 incorporated into a flexible circuit 310. The service segment 300 is an area of predetermined length and width that divides the flexible circuit 310 into a removable portion 312 and a remaining portion 314. The service segment 300 has contact pads 340, keyed notches 320, 330, and a cut zone 360. The contact pads 340 are portions of the flexible circuit 310 conductive material patterned as a multiplicity of parallel, evenly-spaced generally rectangular regions separated by the flexible circuit 310 insulator material. The contact pads are generally in electrical continuity with various traces patterned from conductive material throughout the flexible circuit. The keyed notches are cutouts in the edges of the flexible circuit 310 and include a wide notch 320 and a narrow notch 330, which orient the slider 502 (FIG. 5) attachment to the service segment 300, as described below with respect to FIGS. 5–6. The cut zone 360 is an area within the service segment 300 defining the boundaries where the flexible circuit 310 can be severed in order to separate the removable portion 312 from the remaining portion 314. The dimensions of the cut zone 360 and its location within the service segment 300 are determined by characteristics of the slider assembly 500 (FIG. 5) and the contact assembly 800 (FIG. 8), as described below with respect to FIG. 7. The service segment 300 is described in detail with respect to FIG. 14.

The Slider Assembly and the Flexible Circuit Cut Procedure

FIGS. 4–7 describe the slider assembly 500 and the cut aspect of the flexible circuit cut and splice procedure. The slider assembly 500 is described in detail with respect to FIGS. 15–16.

Figure 4:
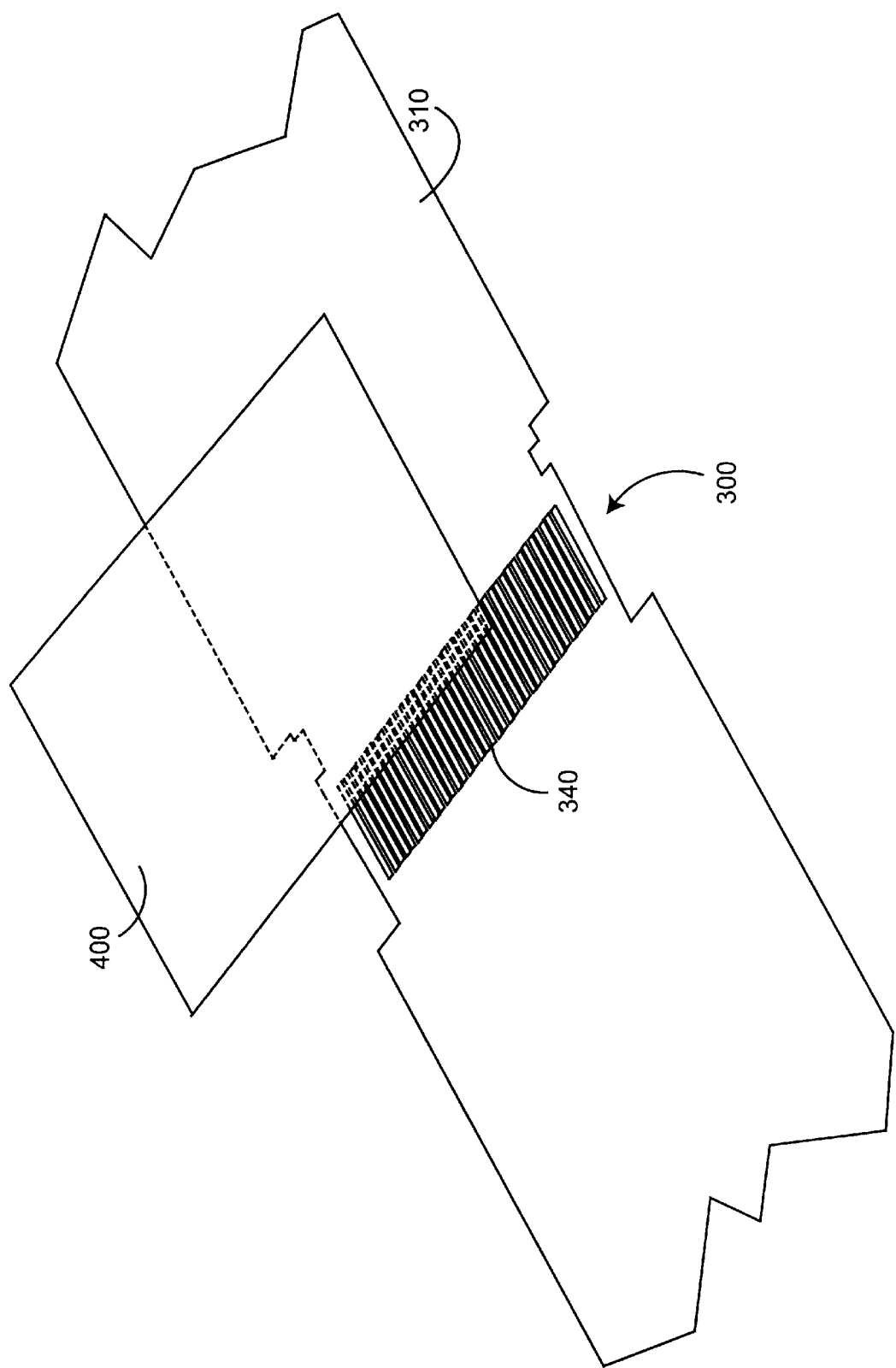
FIG. 4 is a perspective view of a protective layer for the service segment contact pads.

FIG. 4 illustrates a protective cover 400 that covers the service segment 300 until it is used. The protective cover 400 is an adhesive-backed insulator, such as mylar tape, that is removed from a service segment 300 before attaching a slider assembly 500 (FIG. 5) and before performing a cut and splice. The cover 400 insulates the contact pads 340 to prevent inadvertent electrical shorts and to environmentally protect the pads 340 to retard oxidation and corrosion.

Figure 5:
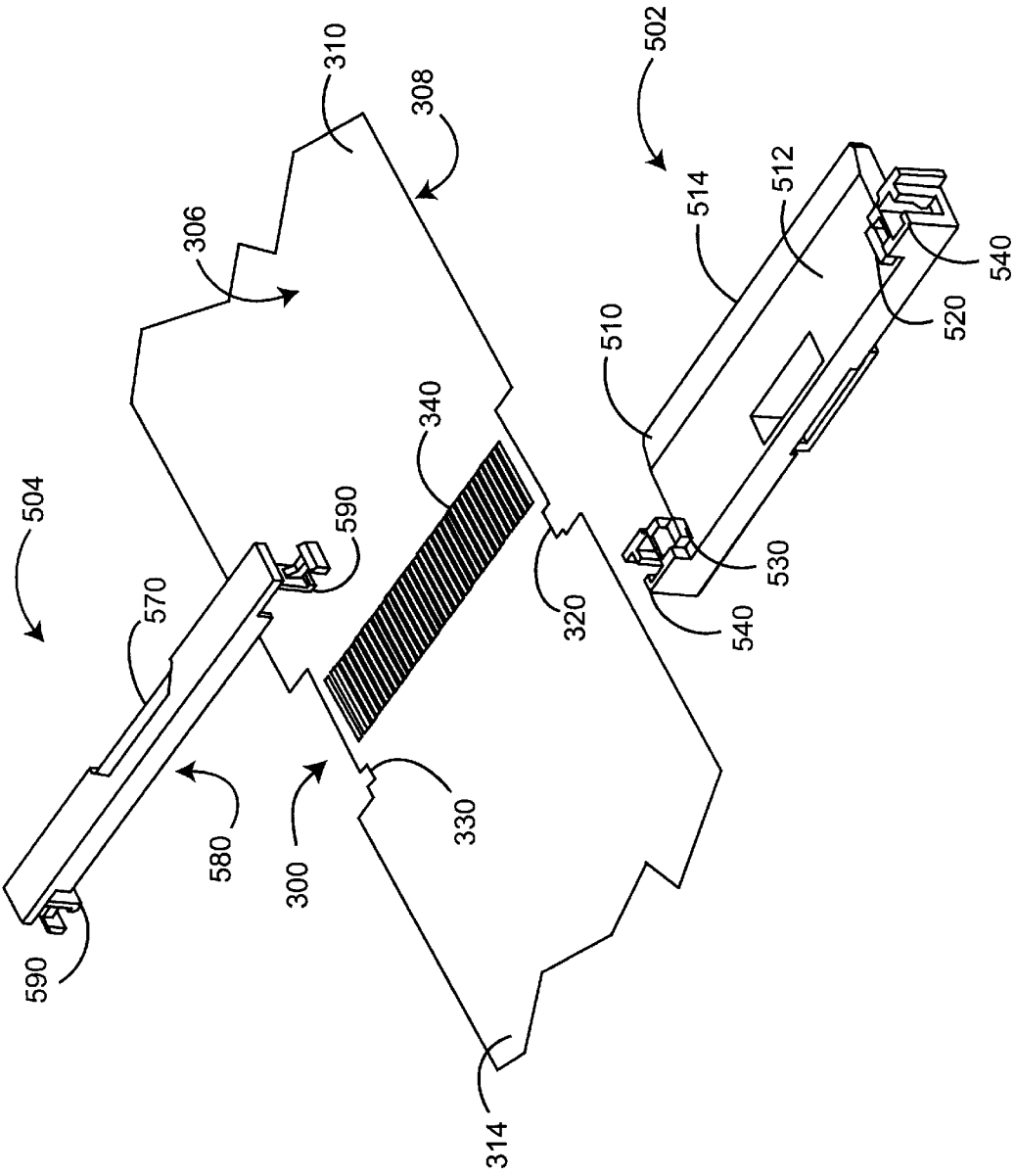
FIG. 5 is a perspective, exploded view of a service segment and attached slider assembly.

As shown in FIG. 5, the slider assembly 500 snaps onto a service segment 300. The slider assembly 500 has a slider 502 and a lock 504. The slider 502 is oriented beneath the flexible circuit underside 308 so that the wide key 520 aligns with the wide notch 320 and the narrow key 530 aligns with the narrow notch 330. The slider keys 520, 530 and the keyed notches 320, 330 insure that the slider 502 is aligned with the planar shelf 510 extending toward the contact pads 340. The slider 502 is then positioned within the notches 320, 330 so that the flexible circuit underside 308 contacts the shelf top face 512, with the shelf 510 supporting the contact pads 340.

Also shown in FIG. 5, the lock 504 is oriented above the flexible circuit topside 306 with the locking tabs 590 extending toward the slider sockets 540. The lock bottom face 580 has a wide indent 584 (FIG. 16E) and a narrow indent 586 (FIG. 16E) that match with that the wide key 520 and narrow key 530, respectively. The keyed indents 584, 586 insure the lock 504 is aligned with the cutout 570 facing the contact pads 340. The lock 504 snaps onto the slider 502 by inserting the tabs 590 into the sockets 540. A locking tab latch 594 (FIG. 16C) engages with a socket catch 542 (FIG. 15F) securing together the lock 504, the flexible circuit 310 and the slider 502, as shown in FIG. 6 and described below.

Figure 6:
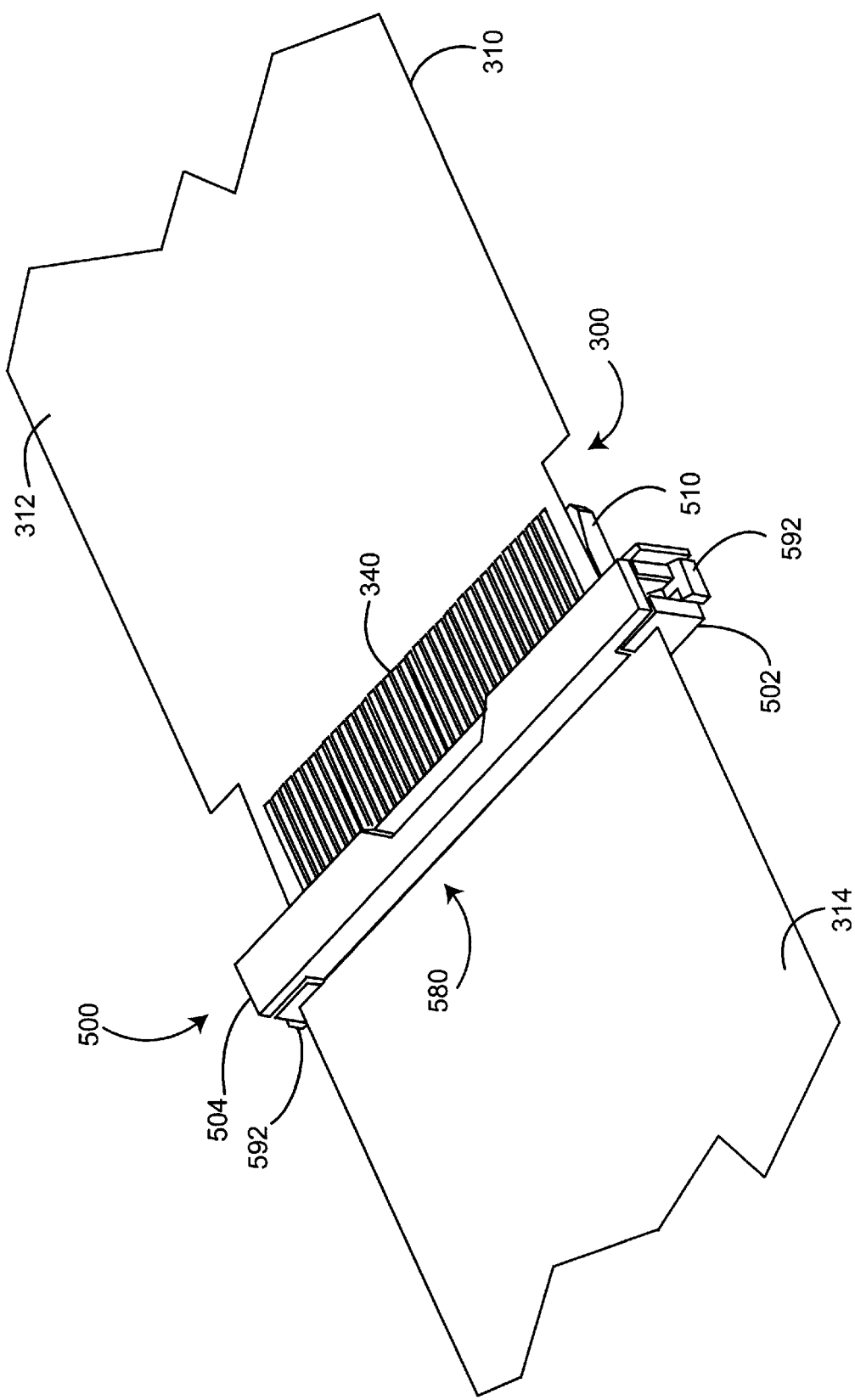
FIG. 6 is a perspective top view of a service segment and attached slider assembly.
Figure 7:
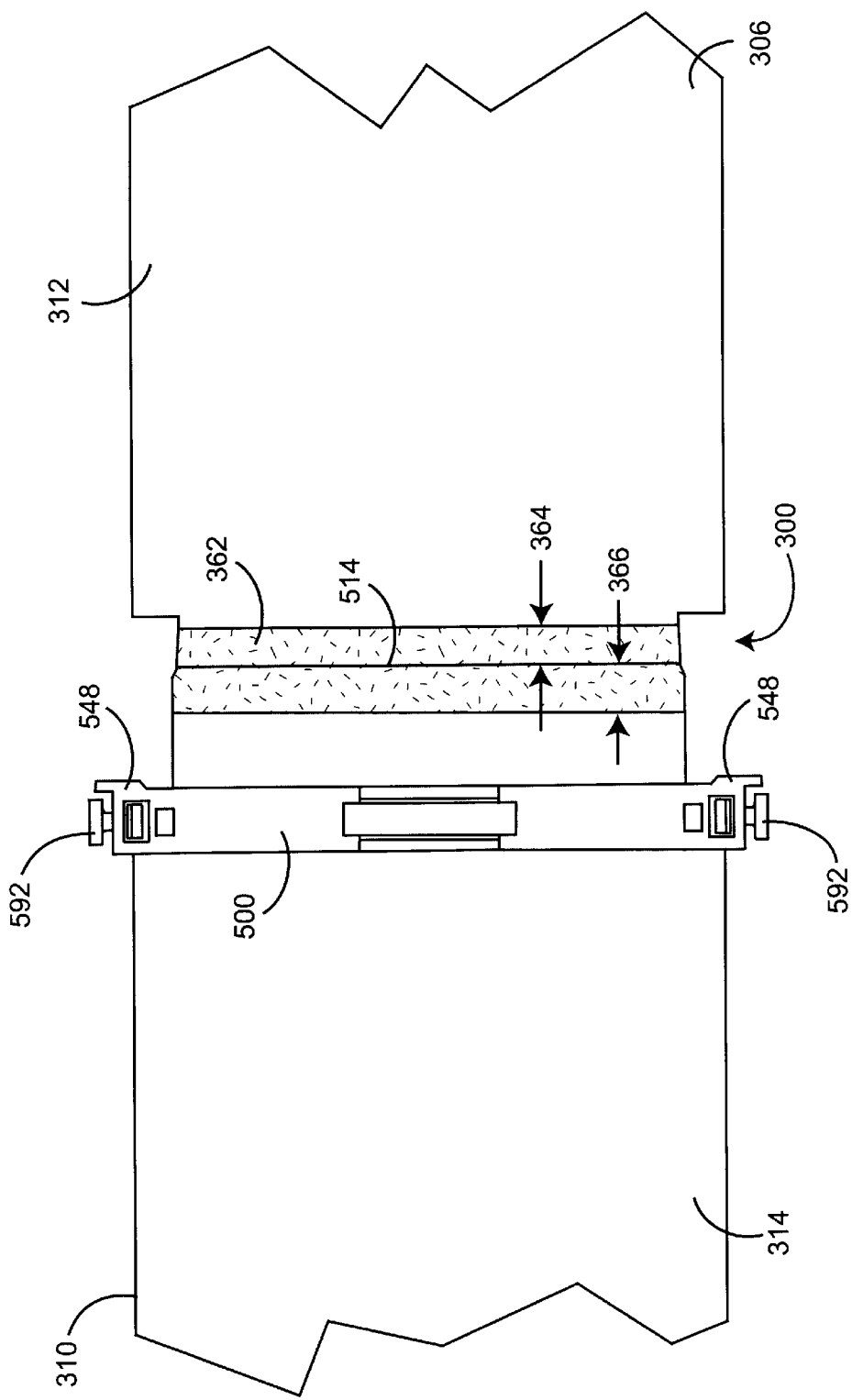
FIG. 7 is a bottom view of a service segment, a cut zone and an attached slider assembly.

FIGS. 6–7 illustrate the slider assembly 500 attached to a service segment 300. As shown in FIG. 6, the attached slider assembly 500 is configured so that the flexible circuit 310 is retained between the lock bottom face 580 and the shelf top face 512 (FIG. 5) and so that the slider 502 is retained within the service segment notches 320, 330 (FIG. 5). The slider shelf 510 extends underneath and supports the contact pads 340. The slider assembly 500 can be disengaged from the flexible circuit 310 by unsnapping the slider 502 and lock 504 portions. This is accomplished by simultaneously pressing the lock releases 592. This disengages the locking tabs 594 (FIG. 16C) from the socket catches 542 (FIG. 15F), allowing the lock 504 to be lifted from slider 502 and the slider assembly 500 to be removed from the flexible circuit 310 and reused.

Figure 9:
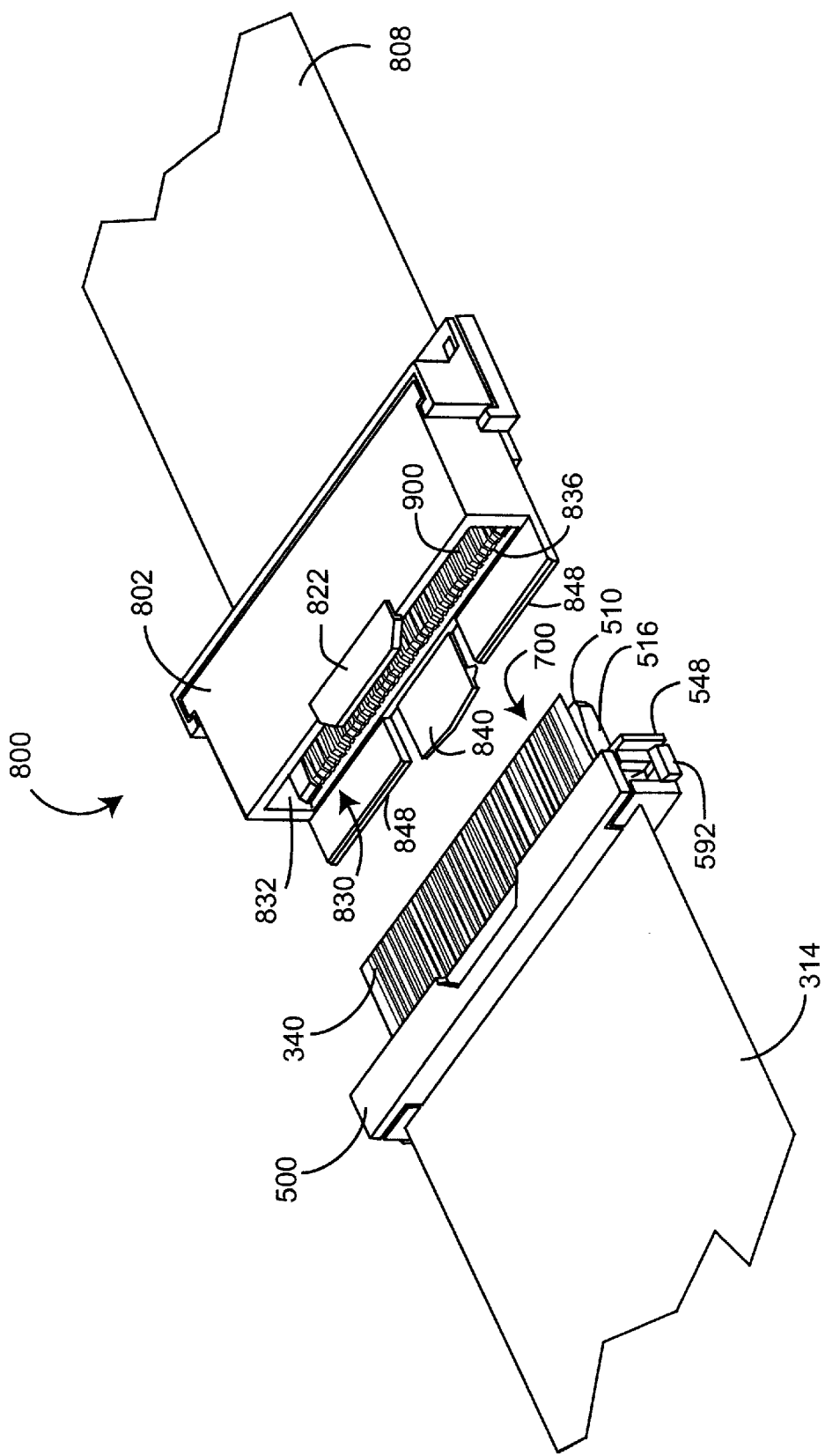
FIG. 9 is a perspective view of an unconnected splice socket and mating splice plug.

FIG. 7 illustrates the flexible circuit underside 306 with the attached slider assembly 500. Within the service segment 300 is a cut zone 362 (shaded area). The flexible circuit 310 can be severed across any portion of the cut zone 362. Advantageously, the cut does not have to be precisely straight, because registration of the contact pads 340 (FIG. 3) and the contacts 900 (FIG. 9) is not dependent on location of the severed end within the contact assembly socket 830 (FIG. 9). Thus, a successful splice can be achieved when the flexible circuit 310 is cut with many different tools along a straight, curved or even jagged line, so long as the cut is entirely within the cut zone 362.

Figure 17B:
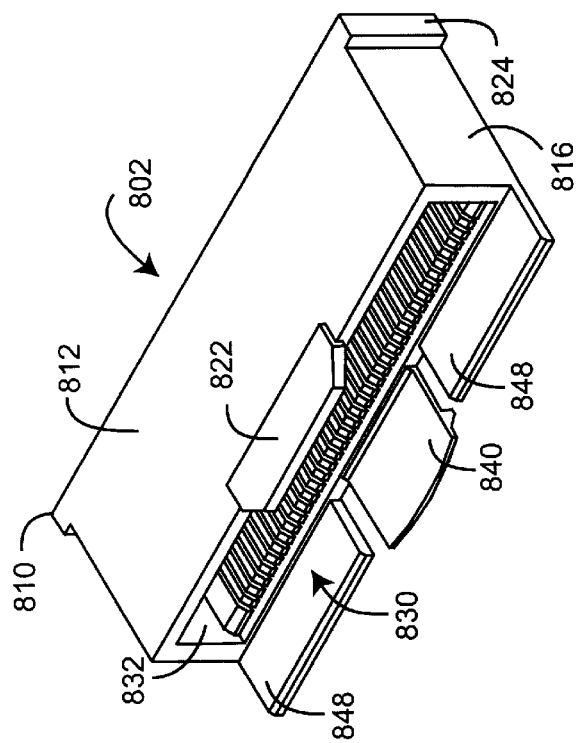
FIGS. 17A–G are top, perspective, front and side, sectional and detailed views of the insulator.
Figure 17D:
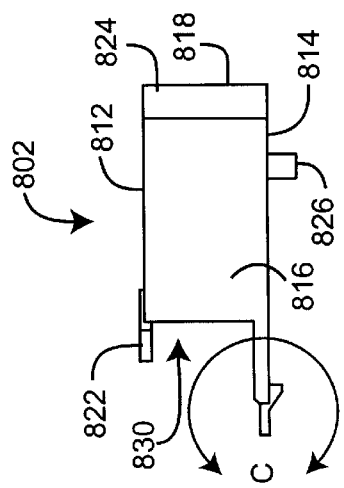
Figure 17A:
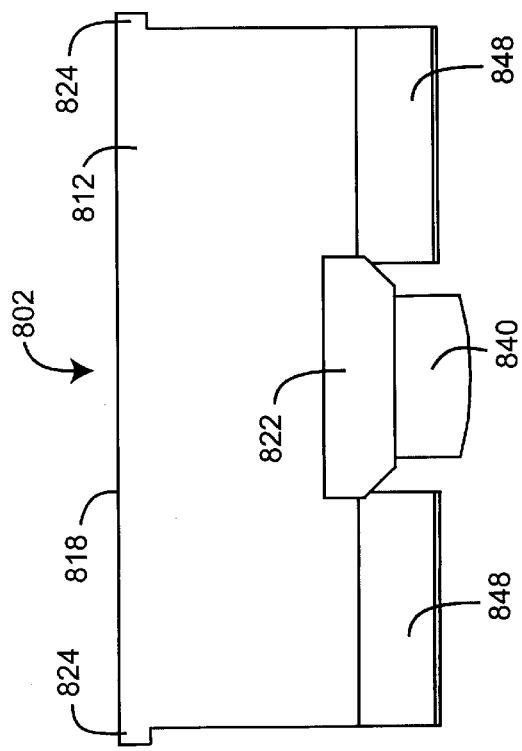
Figure 17C:
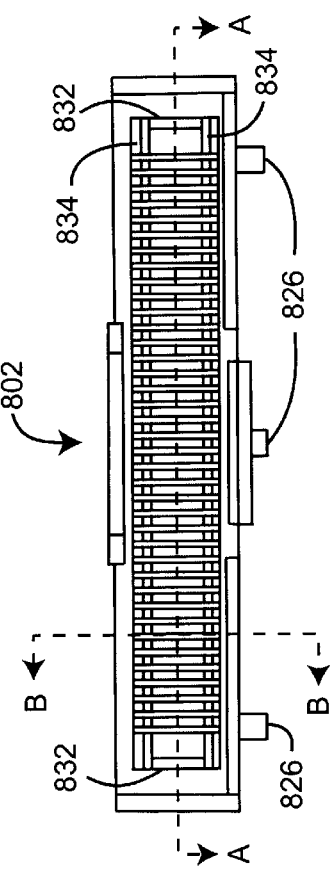
Figure 17F:
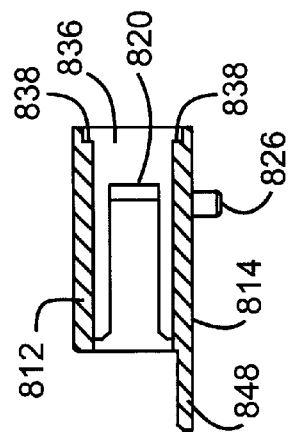

Also shown in FIG. 7, a cutting guide is provided by the slider straightedge 514, which lies within the cut zone 362. In a particular embodiment, the cut zone extends a distance 364 of 5 mm in front of the straightedge 514 and a distance 366 of 5 mm in back of the straightedge 514, for a total length of 10 mm. The front distance 364 is limited by the space between the straightedge 514 and the insulator housing inside wall 820 (FIG. 17F) when the slider assembly 500 and the contact assembly 800 are fully engaged. The back distance 366 is limited by the distance from the insulator housing inside wall 820 (FIG. 17F) to an installed contact tip 934 (FIG. 17B).

The Contact Assembly and the Flexible Circuit Splice Procedure

Figure 8:
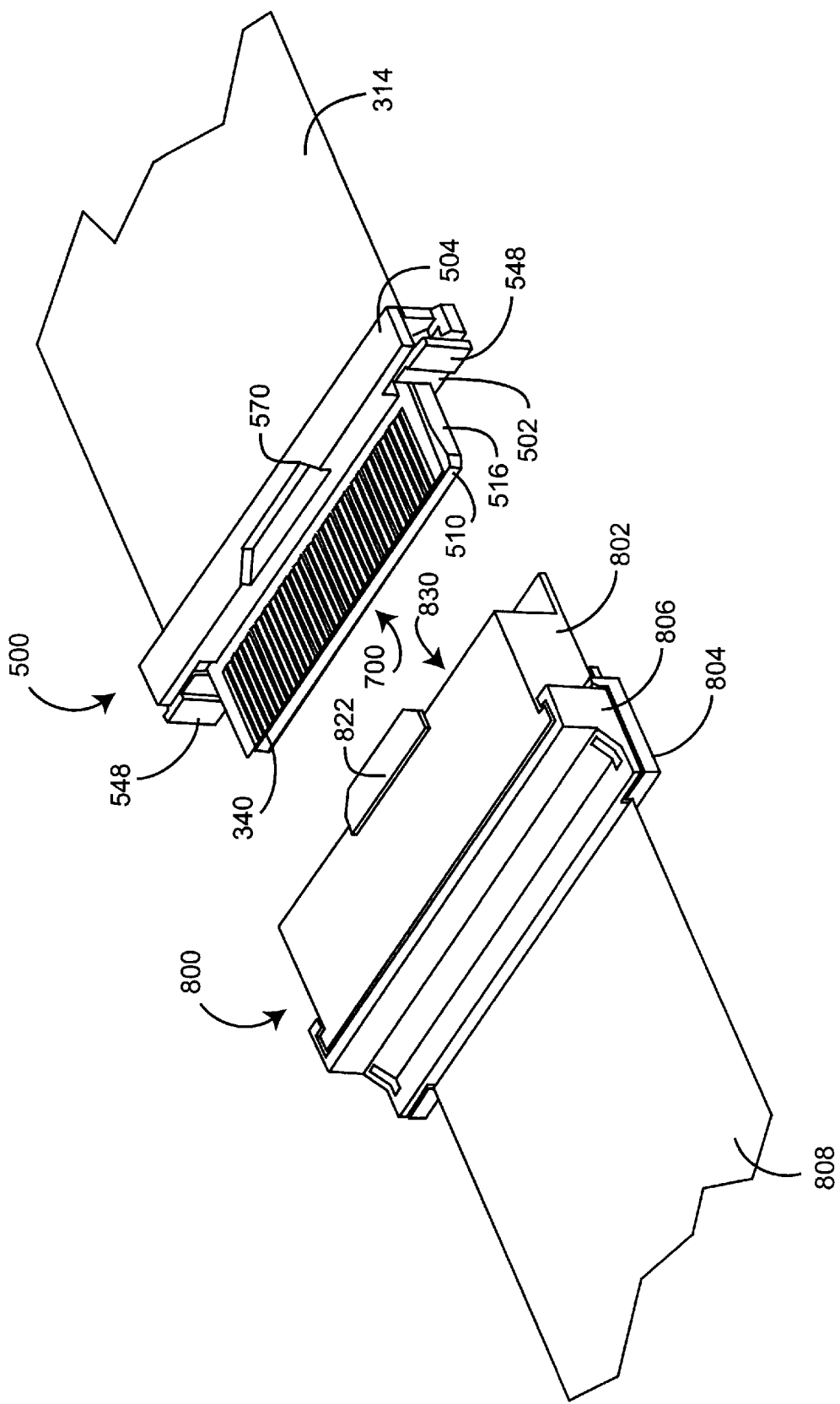
FIG. 8 is a perspective view of an unconnected slider assembly and contact assembly.

FIGS. 8–11 illustrate the contact assembly 800 and its use for splicing a replacement flexible circuit 808 to the remaining flexible circuit 314 after the cut procedure described above. FIGS. 8–9 illustrate the splice plug 700 and mating contact socket 830 prior to completing the splice operation. In particular, FIG. 8 focuses on the splice plug 700 formed from the service segment contact pads 340 and attached slider assembly 500 after cutting away the removable portion 312 (FIG. 7) of the flexible circuit 310 (FIG. 7). FIG. 9 focuses on the mating contact socket 830 portion of the contact assembly 800. The contact assembly 800 is described in detail with respect to FIGS. 17–20.

As shown in FIG. 8, the contact assembly 800 has an insulator 802 and a strain relief 804, 806 and is connected to a replacement flexible circuit 808. As described below with respect to FIGS. 12–13, the contact assembly 800 is pre-attached to the replacement flexible circuit 808. The replacement flexible circuit 808, may, in turn, be connected to a replacement device (not shown). To splice the remaining flexible circuit 314 to the replacement flexible circuit 808, the slider assembly 500 is positioned opposite the contact assembly 800. The splice is achieved by utilizing the release guards 548 to grip the slider assembly 500 and, simultaneously gripping the contact assembly 800, pressing the two assemblies together (see FIG. 10). In making the splice, the splice plug 700 is inserted into the contact socket 830. Each of the contact pads 340 connect with a corresponding contact 900 (FIG. 9) housed within the socket 830, establishing an electrical connection between the remaining flexible circuit 314 and the replacement flexible circuit 808. The insulator tab 822 fits within the lock cutout 570, securing the lock 504 and the slider 502 together and preventing them from disengaging once the splice has been achieved.

Figure 17E:
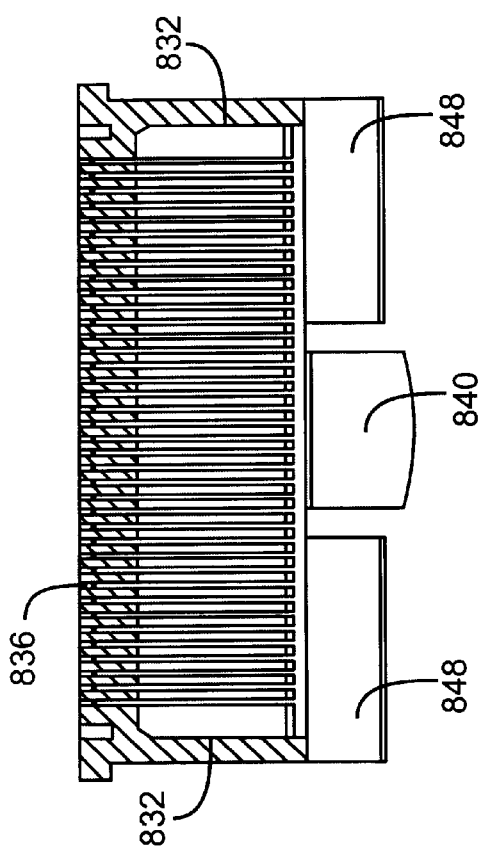
Figure 17G:
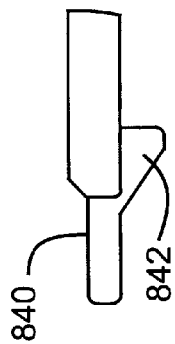

As shown in FIG. 9, the insulator 802 has a splice socket 830 configured to accept the splice plug 700. The socket 830 houses a multiplicity of contacts 900 that are fitted into slots 836 (FIG. 17E). The insulator 802 has guides 848 that help position the plug 700 into the socket 830. The guides 848 in conjunction with the tab 822 serve to maintain the attachment together of the slider 502 and lock 504. A locking lever 840 latches the contact assembly 800 to the slider assembly 500, as described below with respect to FIG. 11. The slider assembly 500 mates with the contact assembly 800 in a manner that the contact pads 340 make an electrical connection with contacts 900 located within the insulator 802. The contact pads 340 are in electrical continuity with trace conductors within the remaining flexible circuit 314. The contacts 900 are soldered to solder pads 809 (FIG. 12) that are in electrical continuity with trace conductors within the replacement flexible circuit 808. Thus, the attachment of the slider assembly 500 and the contact assembly 800 splices the conductors within the remaining flexible circuit portion 314 to the conductors in the replacement flexible circuit 808.

Also shown in FIG. 9, each of the contacts 900 correspond to one of the contact pads 340 of the splice plug 700. Registration of the contacts 900 with the contact pads 340 is achieved with the location of the slider keys 520, 530 (FIG. 5) within the service segment notches 320, 330 (FIG. 5) and the location of the shelf sides 516 against the inside of the socket side walls 832. Specifically the notches 320, 330 locate the contact pads 340 with respect to the slider shelf 510, and the shelf sides 516 locate the shelf 510 with respect to the socket 830, thereby locating the contacts 900 with respect to the contact pads 340.

Figure 10:
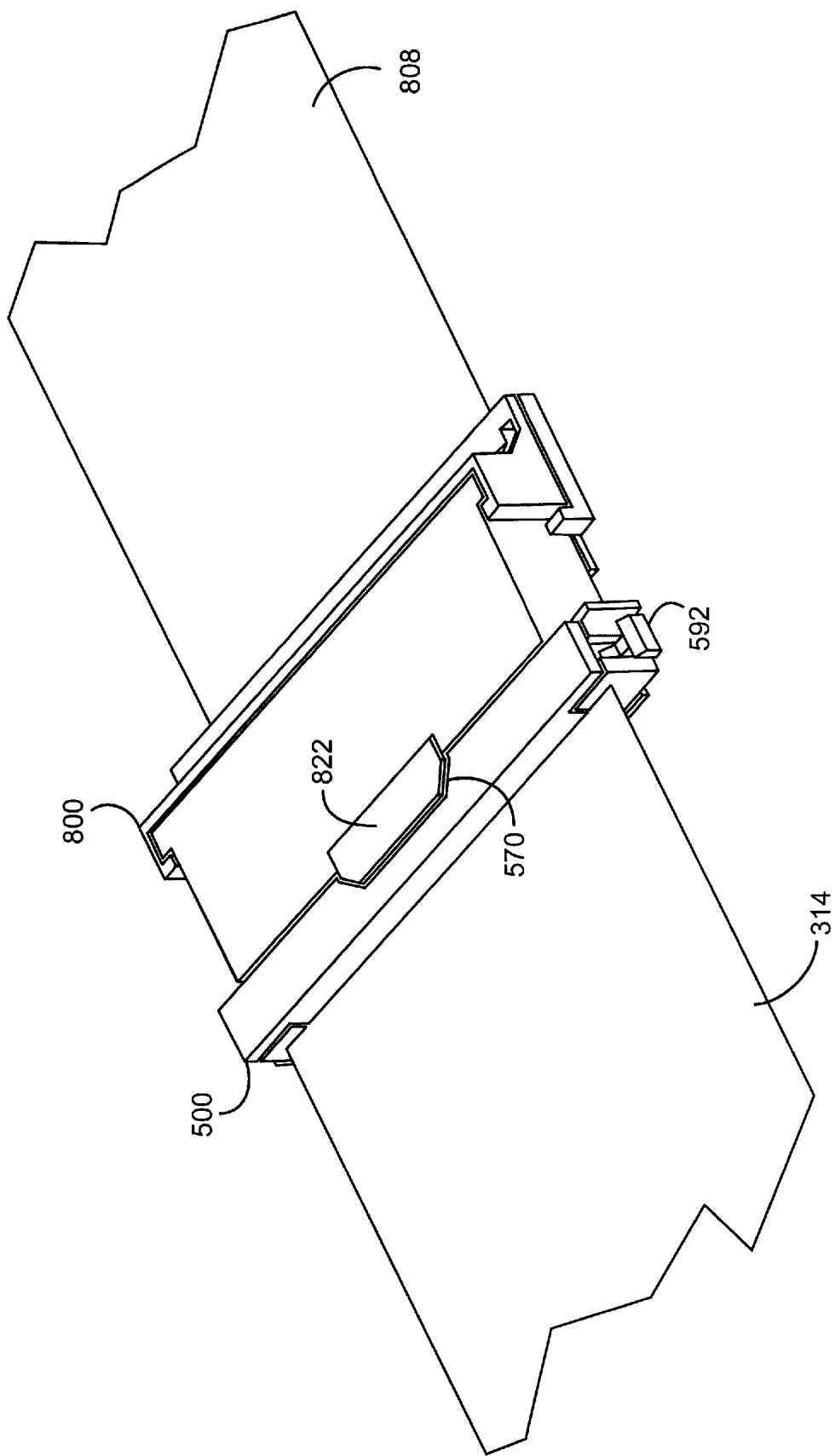
FIG. 10 is a perspective top view of a completed splice.
Figure 11:
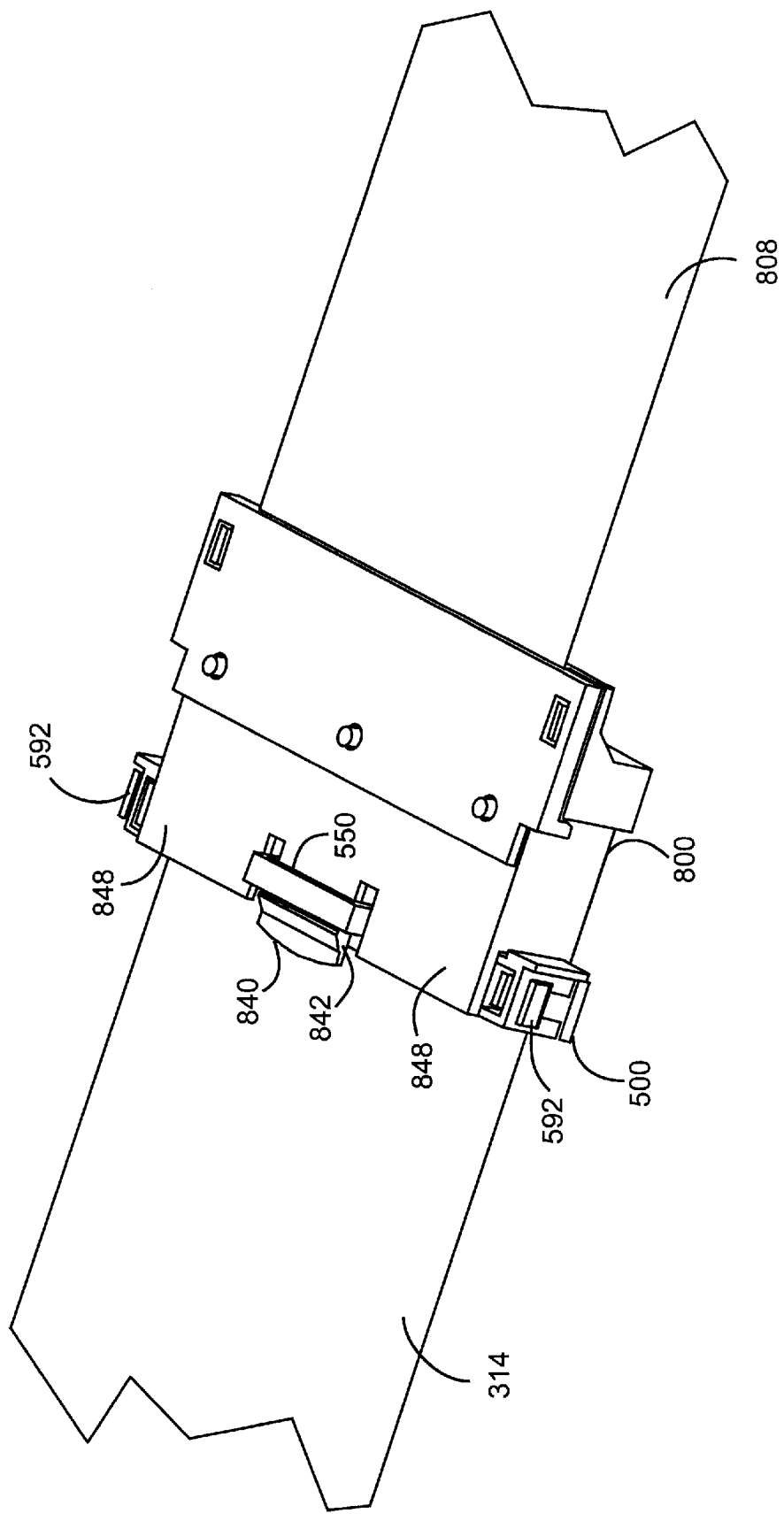
FIG. 11 is a perspective bottom view of a completed splice.

FIGS. 10–11 illustrate the completed splice of the remaining flexible circuit portion 314 to the replacement flexible circuit 808. The slider assembly 500 is attached to the contact assembly 800. The contact assembly locking lever 840 is inserted through the slider assembly locking slot 550. In doing so, a lever catch 842 slides along a beveled portion 558 (FIG. 15E) of the slot 550. This lifts the lever 840 over the slot 550 until the catch engages the back wall 552 of the slot 550, retaining the lever 840 within the slot 550 and the slider assembly 500 attached to the contact assembly 800. In this position the slider assembly 500 is engaged on one side by the insulator tab 822 fitted within the lock cutout 570 and on the other side by the guides 848 pressed against the raised stop portion 519 of the shelf bottom face 517 (FIG. 15D). Thus, the tab 822 and guides 848 serve to secure the attachment of the lock 504 to the slider 502, advantageously preventing wear or inadvertent pressure on the releases 592 from allowing the flexible circuit 314 to disengage from the slider assembly 500.

Contact Assembly Attachment to the Replacement Circuit

Figure 12:
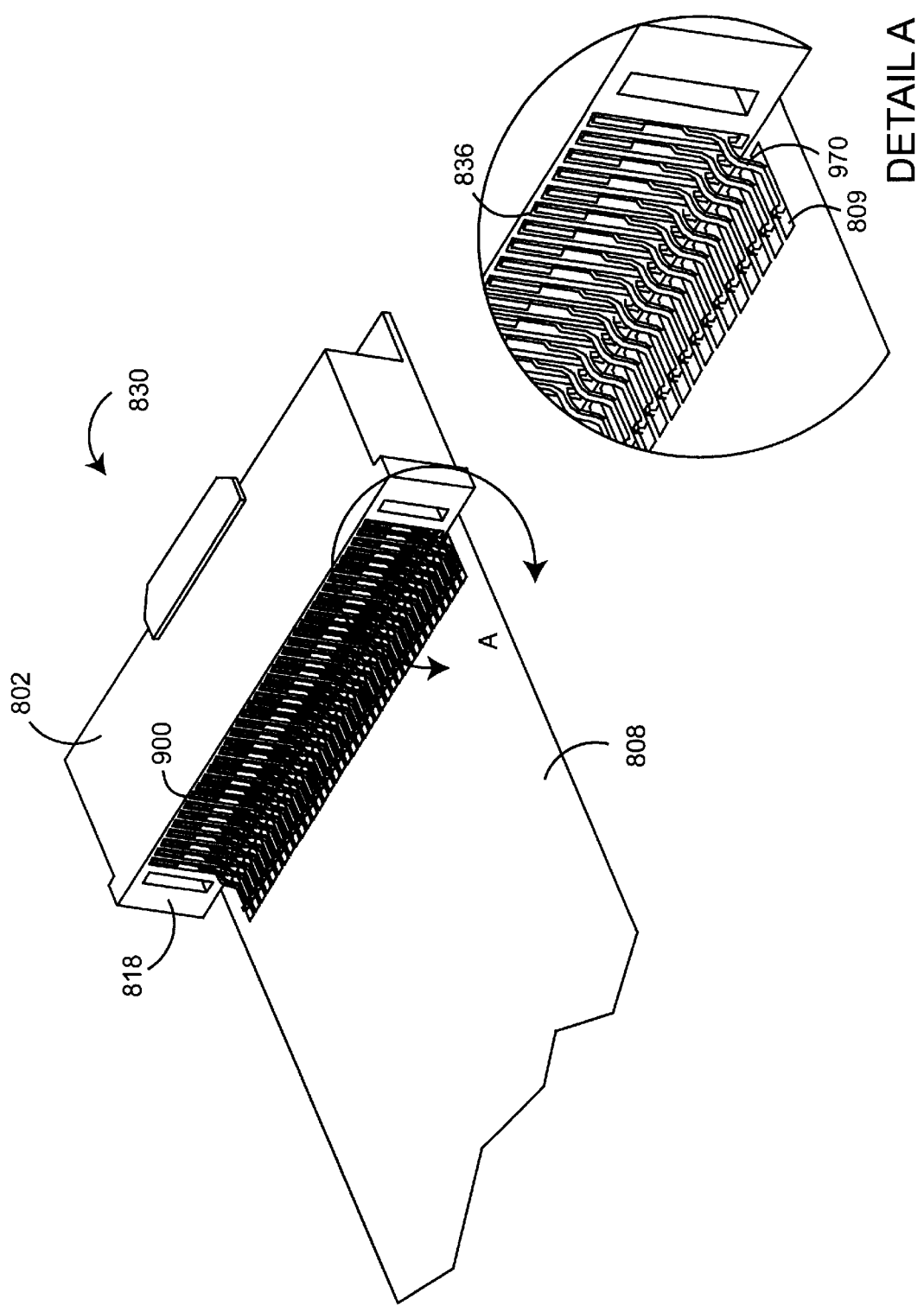
FIG. 12 is a perspective view of contacts installed in an associated insulator and connected to a replacement flexible circuit.
Figure 13:
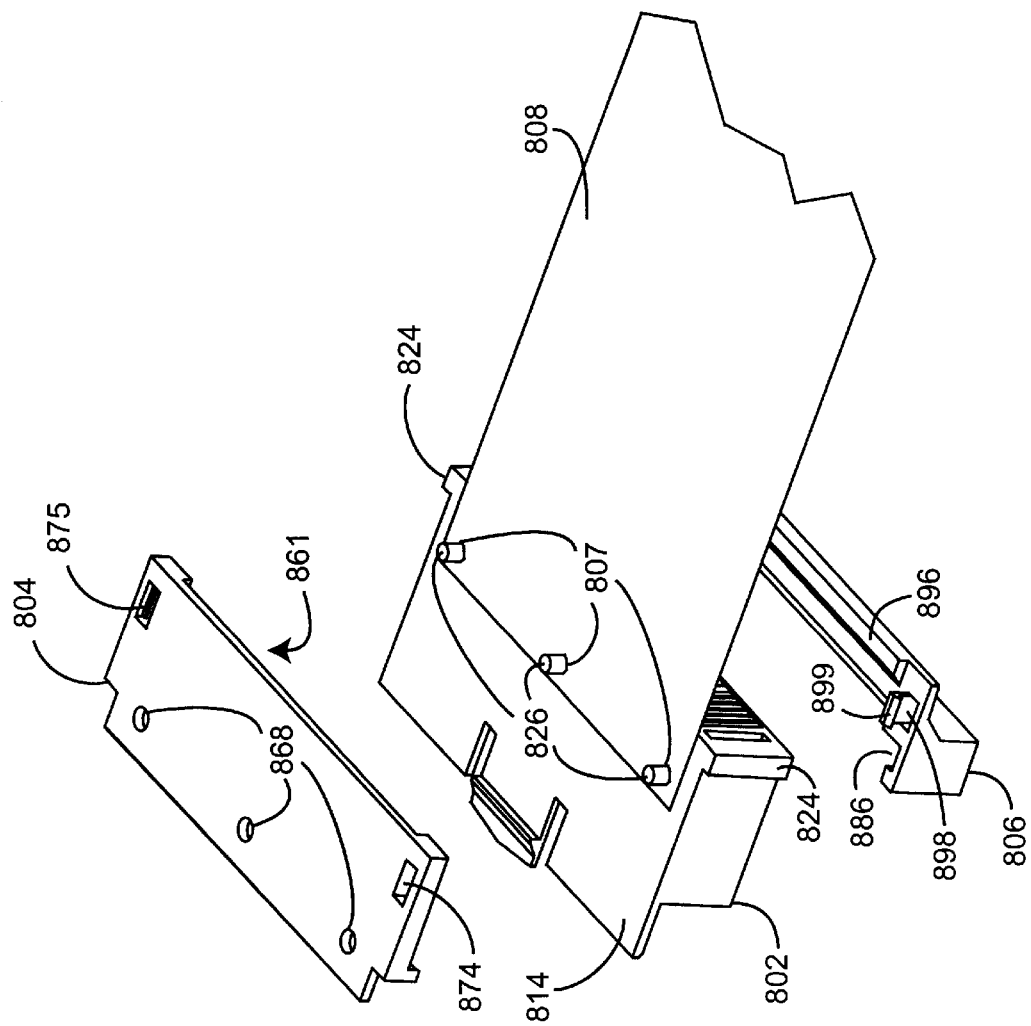
FIG. 13 is a bottom perspective view of the insulator housing illustrating installation of the strain relief.

FIGS. 12–13 illustrate the attachment of the contact assembly 800 to a replacement flexible circuit 808. FIG. 12 illustrates connection of contacts 900 to the replacement flexible circuit 808. The contacts 900 are described in detail below with respect to FIGS. 18A–C. The contacts 900 are pressed into slots 836 that extend from the insulator back plate 818 into the insulator socket 830 (not visible). Each contact 900 has a soldertail 970 that extends from the back plate 818. The soldertails 970 of the installed contacts 900 are soldered to the corresponding solder pads 809 on the end of the replacement flexible circuit 808. In this manner, the insulator 802 and the corresponding installed contacts 900 are physically attached to the replacement flexible circuit 808. Further, the contacts 900 are electrically connected to conductors within the replacement flexible circuit 808 via the solder pads 809. The insulator 802 is also physically connected to the flexible circuit 808 by heat stakes 826 (FIG. 13) as described below.

FIG. 13 illustrates installation of the strain relief bottom 804 and top 806 onto the insulator 802 and replacement flexible circuit 808. The insulator heat stakes 826 are mounted through corresponding flexible circuit holes 807. Corresponding holes 868 on the strain relief bottom 804 are mounted over the heat stakes 826 so that the flexible circuit 808 is between the strain relief top face 861 and the insulator bottom face 814. The heat stakes 826 are then melted, securing together the flex circuit 808, the strain relief bottom 804 and the insulator 802. The strain relief top 806 slides onto the insulator 802 with the tongues 824 fitted within the grooves 886. The strain relief top 806 snaps onto the strain relief bottom 804 with the tabs 898 inserted into the bottom sockets 874. The latches 899 at the tip of the tabs 898 engage the catches 875 inside the sockets 874, attaching together the strain relief bottom 804 and top 806 with the flexible circuit 808 secured between the top clamp 896 and the top face 861. Accordingly, any strain on flex circuit 808 is distributed to the clamp 896, top face 861 and insulator heat stakes 826 rather than solely to solder joints between contact soldertails 970 and flex circuit solder pads 809. Further, the strain relief top 806 covers the exposed portions of the contacts 900 and solder pads 809, providing some environmental protection and insulation from inadvertent shorts. Although the contact assembly 800 is described above as attached to a replacement flexible circuit 808, one of ordinary skill will recognize that a contact assembly can be configured for like or similar attachment to a rigid circuit board or for equivalent incorporation into any circuit, module or device.

Service Segment Details

Figure 14:
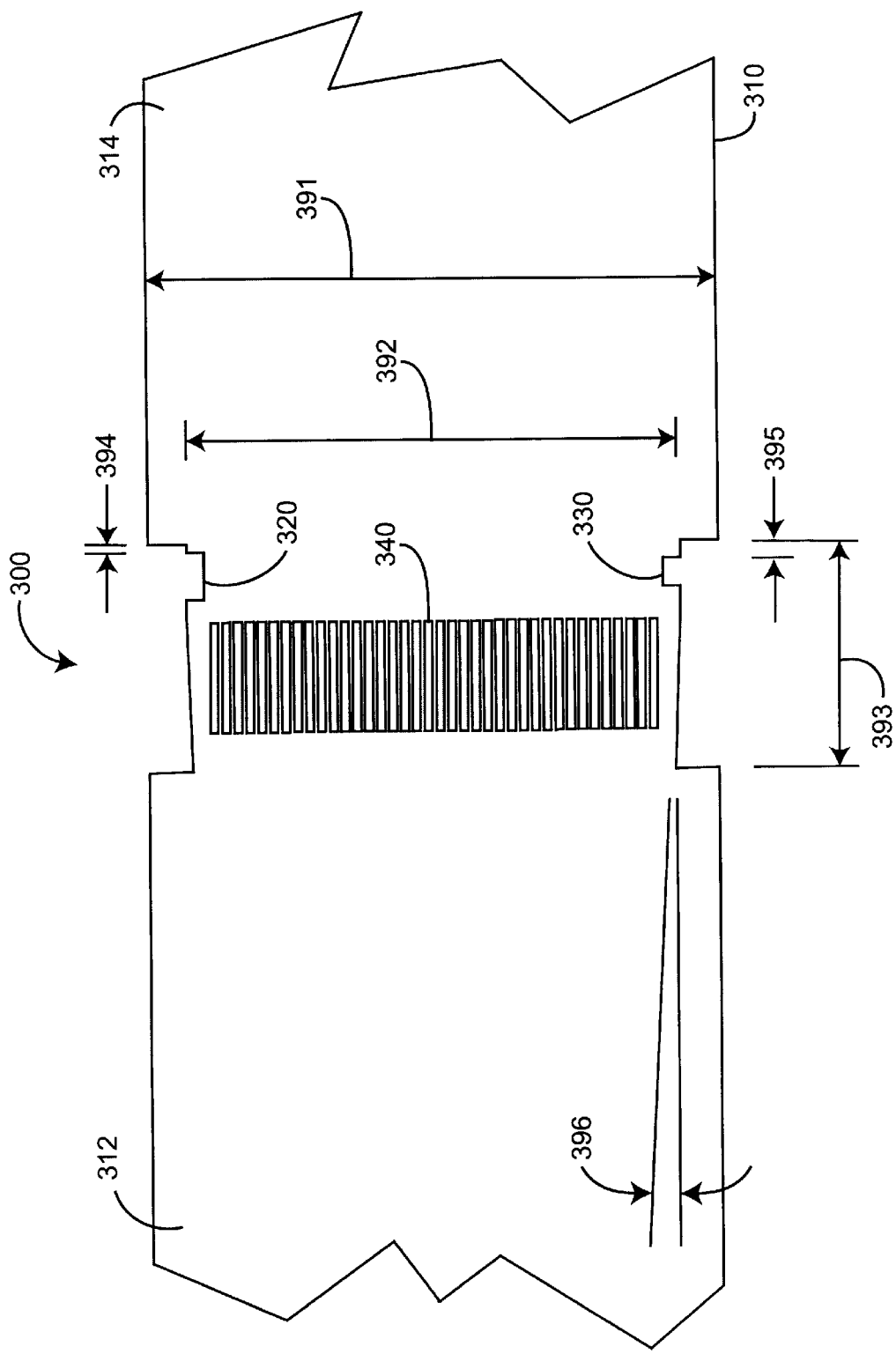
FIG. 14 is a top view of the service segment.

FIG. 14 illustrates details of a particular service segment 300 embodiment. The service segment 300 has 38 contact pads 340 each 1×14 mm on 1.5 mm centers. The service segment 300 is 29 mm (393)×62.3 mm (392) and is depicted on a 72 mm wide (391) flexible circuit 310. The wide notch 320 is 6 mm×2.15 mm. The narrow notch 330 is 3.5×2.15 mm. The wide notch 320 is located 1 mm (394) from the boundary of the service segment 300. The narrow notch 330 is located 2.25 mm (395) from the boundary of the service segment 300. Each edge of the service segment 300 has a 2° (396) bevel, so that the service segment 300 is wider nearer the notches 320, 330. This bevel facilitates insertion of the remaining portion 314 severed end into the insulator socket 830 (FIG. 9) to complete a splice.

One of ordinary skill will recognize that a service segment 300 is not limited to 38 contact pads 340. Embodiments having between 5 and 50 contact pads 340 may be of particular utility, although it is contemplated that a service segment with fewer than 5 or greater than 50 contact pads 340 is within the scope of the present invention. It should also be recognized that some of the contact pads 340 may not be used, i.e. connected to other traces within the flexible circuit 310. Further, the embodiment of a service segment 300 depicted in FIG. 14 has a width 392 that is less than the width 391 of the flexible circuit 310. One of ordinary skill will recognize that the service segment can be equal to or greater than the width of the surrounding flexible circuit 310.

Slider Assembly Details

FIGS. 15–16 illustrate details of slider assembly 500 (FIG. 6) components. FIGS. 15A–F illustrate detailed features of the slider 502. As described above with respect to FIGS. 5–7, the slider 502 forms the bottom half of the slider assembly 500 (FIG. 6) and is attached to a service segment 300 (FIG. 3) with a snap-on lock 504 (FIG. 5). Also described above with respect to FIGS. 8–9, the slider 502, in conjunction with contact pads 340 (FIG. 8) on the severed end of a remaining flexible circuit portion 314 (FIG. 8) forms a splice plug 700 (FIG. 8) to splice into a contact assembly socket 830 (FIG. 9).

As shown in FIGS. 15A–F, the slider 502 has a planar shelf 510, a wide key 520, a narrow key 530, sockets 540, guards 548 and a locking slot 550. The shelf 510 has a top face 512 and an opposite bottom face 517. Forming the periphery of the shelf 510 between the top face 512 and bottom face 517 is a straightedge 514, sides 516, and a back edge 518. The top face 512 has a chamfer 513 extending between the sides 516 along the straightedge 514. The contact tip leading edge 932 (FIG. 18B) compresses the flexible circuit 314 (FIG. 8) and contact pads 340 (FIG. 8) against the chamfer 513 upon insertion of the splice plug 700 (FIG. 8) into the contact socket 830 (FIG. 8). In this manner, the contact point 934 (FIG. 18B) slides along the contact pads 340 (FIG. 8) with increasing pressure as the contact tip 930 (FIG. 18B) travels up the slope of the chamfer 513 to the thickest part of the shelf 510. At full insertion of the splice plug 700 (FIG. 8) into the contact socket 830 (FIG. 8), the contact pads 340 (FIG. 8) conform to the trailing edge 936, point 934 and leading edge 932 of the contact tip 930 (FIG. 18B), creating a gas-tight connection.

Figure 16B:
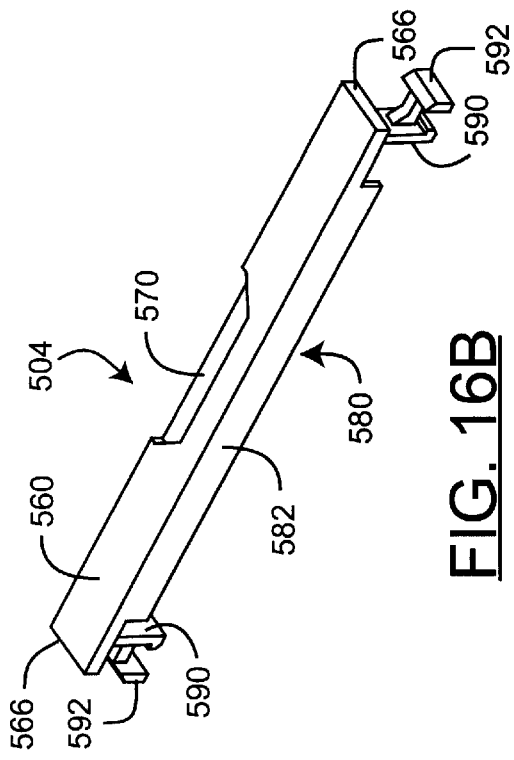
FIGS. 16A–E are top, perspective, front, side and bottom views of the lock.
Figure 16D:
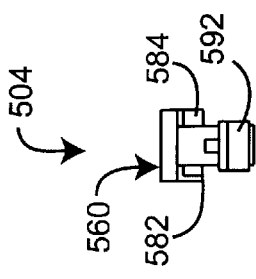
Figure 16A:
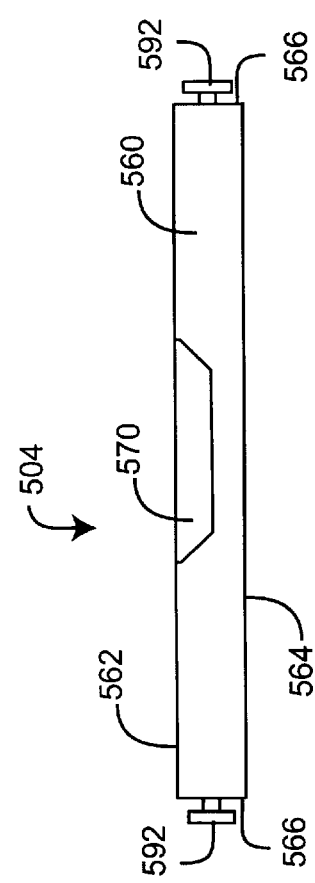
Figure 16C:
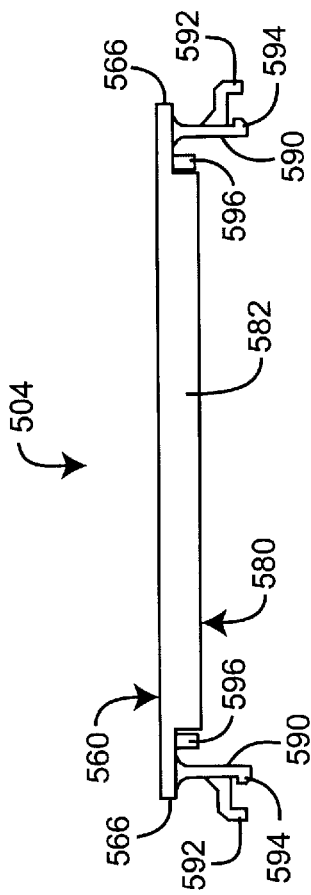
Figure 16E:
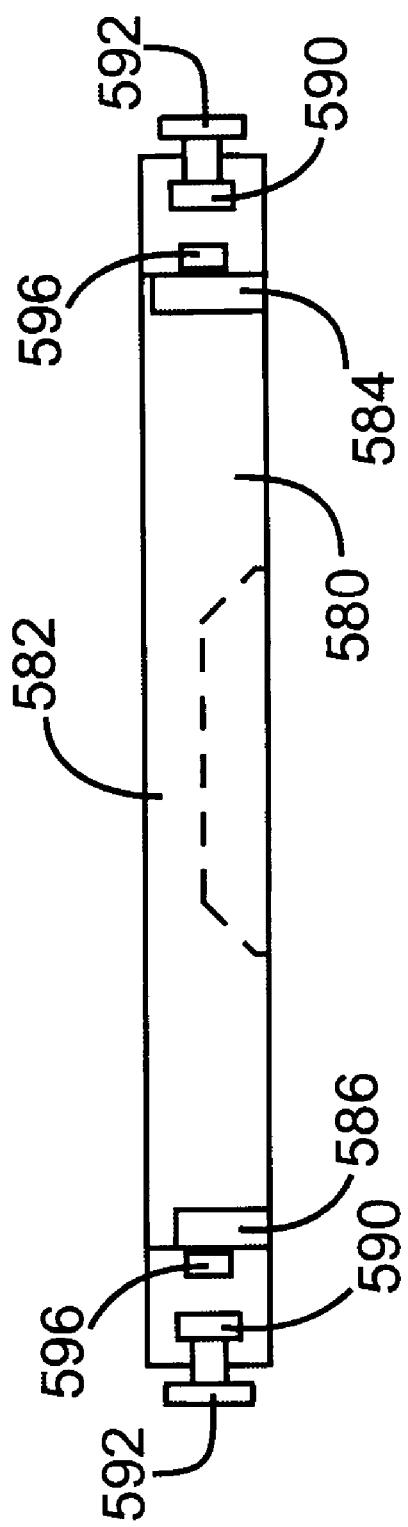

Also shown in FIGS. 15A–F, the top face 512 has a wide key 520 and a narrow key 530 each positioned near one of the sides 516. The bottom face 517 has a raised stop portion 519 that extends between the sides 516 along the back edge 518. The sockets 540 extend from each side 516 adjacent the back edge 518 and perpendicular to the shelf 512 from the raised stop portion 519 to beyond the top face 512. Each socket 540 has catches 542, release slots 544 and release guards 548. The catches 542 are located on opposite interior sides of each socket 540 adjacent the release slots 544. Each socket 540 defines or forms an external slot 544 that accepts the lock release 592 (FIG. 16C). A raised bar 552 and a generally rectangular cutout portion 554 of the back edge 518 define a locking slot 550. The bar 552 has a beveled portion 558 sloping down toward the straightedge 514.

In a particular embodiment, the slider 502 is 23×81.5 mm overall. The shelf 510 is 23×62.65×3.8 mm. The chamfer 513 is 10° and 6.448 mm in length. The sockets 540 are 7.5×7.425×8.4 mm. The back edge 518 is 62.65×5.65 mm. The wide key 520 and narrow key 530 are 6.1×2.15×2 mm and 3.25×2.15×2 mm, respectively. The socket 540 plus guard 548 are 9 mm in length. The slider 502, lock 504 (FIG. 16B), insulator 802 (FIG. 17B), strain relief bottom 804 (FIG. 19B) and strain relief top 806 (FIG. 20B) are each injection molded as one piece using a polybutylene terephthalate (PBT) resin with added fiberglass, fire retardant and flow enhancer. One such resin is VALOX 553, which is 30% glass reinforced and available from GE Plastics, One Plastics Avenue, Pittsfield, Mass. 01201.

FIGS. 16A–E illustrate detailed features of the lock 504. As described above with respect to FIGS. 5–7, the lock 504 forms the top half of the slider assembly 500 (FIG. 6) and snaps onto the slider 502 (FIG. 5) securing the slider 502 (FIG. 5) with respect to the service segment 300 (FIG. 3). The lock 504 has a top face 560, a cutout 570, a bottom face 580, and locking tabs 590. The top face 560 is generally rectangular, having a front edge 562, back edge 564 and ends 566 around its periphery. The top face 560 defines a cutout 570 extending from the interior of the top face 560 to the front edge 562 and along the front edge 562 toward both ends 566. The bottom face 580 is opposite the top face 560. The tabs 590 extend generally perpendicularly away from the bottom face 580 proximate each end 566. Blocks 596 extend generally perpendicularly away from the bottom face 580 proximate each tab 590 and function as positioning and strengthening structures. Each tab 590 has a release 592 extending past the ends 566 and generally perpendicularly to the tab 590. The end of each tab 590 has a latch 594. The bottom face 580 also has a raised portion 582 between the tabs 590. The raised portion 582 forms a wide indent 584 and a narrow indent 586.

In a particular embodiment, the lock top face 560 is 8×77.5 mm. The lock 504 is 4.8 mm thick at the back edge 564 and 2.2 mm thick at the ends 566. The cutout 570 is 4 mm in length and 24.25 mm wide at the front edge 562, forming a 45° angle along the top face 560. The tabs 590 are 10.3 mm in depth from the top face 560. The indents 584, 586 are 2.1 mm in depth from the raised portion 582. The distance between the tabs 590 is 69.9 mm. The widest width of the raised bottom face portion 582 is 62 mm, and the narrowest width is 57.5 mm. The releases 592 extend 2.5 rmm from each end 566.

Contact Assembly Details

FIGS. 17–20 illustrate details of contact assembly 800 (FIG. 8) components. FIGS. 17A–G illustrate detailed features of the insulator 802. As described above with respect to FIGS. 8–9, the insulator 802 houses contacts 900 that form the splice between the severed end of the remaining flexible circuit 314 and the replacement flexible circuit 808. To do this, the contact assembly 800 mates with and locks to the slider assembly 500.

As shown in FIGS. 17A–F, the insulator 802 has a housing 810, a tab 822, a socket 830 and a locking lever 840. The housing 810 has a top wall 812, an opposite bottom wall 814, side walls 816 and a slotted back wall 818 that form or define the socket 830 between the tab 822 and the locking lever 840. The tab 822 extends from a front portion of the top wall 812. The locking lever 840 and two guides 848 extend from a front portion of the bottom wall 814. The locking lever 840 has a latch 842 protruding away from the bottom wall 814 and along the width of the lever 840. Extending from the bottom wall 814 are three heat stakes 826. Strain relief tongues 824 extend from each side wall 816 along the back wall 818. Slotted liners 834 extend across the interior portion of the top wall 812 and bottom wall 814. The slotted back wall 818 and slotted liners 834 form or define slots 836 that extend from the back wall 818 into the top and bottom portions of the socket 830. Each slot 836 has stops 838 along the back wall 818.

In a particular embodiment, the insulator housing 810 is generally 23×71.3×12 mm, including the tongues 824 along the back wall 818. The tongues 824 are 3.3 mm thick. The bottom wall 814 is 1.925 mm thick. The guides 848 extend 8 mm from the socket 830. The socket 830 is 17×62.8×8.15 mm. The locking lever 840 is 1.5 mm thick and 16 mm wide and extends 34.086 mm from the back wall 818. The latch 842 on the locking lever 840 is located 29 mm from the back wall 818 and is angled at 35°. The tab 822 is 6.85×23.5 mm and has a 45° bevel. The heat stakes 826 are 2.5 mm in diameter and 3 mm in length.

FIGS. 18A–C illustrate detailed features of a contact 900. As described above with respect to FIGS. 8, 9 and 12, a multiplicity of contacts 900 form the electrical connection between the remaining flexible circuit 314 (FIG. 8) and the replacement flexible circuit 808 (FIG. 8) to complete a splice. Each contact 900 has a top edge 901, bottom edge 902, base 910, arm 920, tip 930, support 940, cavity 950, back edge 960 and soldertail 970. The base 910 has stops 912, barbs 914 and a front edge 916. The stops 912 extend from both the top edge 901 and bottom edge 902 along the back edge 960. Barbs 914 are positioned on the top edge 901 proximate the stop 912. The arm 920 extends from the front edge 916 and ends at the tip 930. The support 940 extends from the front edge 916 opposite the arm 920. The arm 920, support 940 and front edge 916 form or define a U-shaped cavity 950. An indent 962 forms a detach point for a multiple contact carrier (not shown). The soldertail 970 extends from the back edge 960 proximate the bottom edge 902. The tip 930 has a leading edge 932, contact point 934 and trailing edge 936.

In a particular embodiment, the contacts 900 are made of WRM Alloy 4085 available from Waterbury Rolling Mills, Inc., 240 E. Aurora Street, Waterbury, Conn. 06708. The contacts 900 are stamped from 0.510 mm thick material with an attached 3.8 mm carrier having a 11 mm progression. The contacts 900 are machine pressed into the insulator slots 836 (FIG. 12) from the back wall 818 (FIG. 12). The support 940 is 19.3 mm in length from the back edge 960 and 1.45 mm in depth. The arm 920 is 15.8 mm from the stop 912 at the top edge 901 to the contact point 934, with a beam of 1 mm. The arm 920 deviates 2° toward the support 940. The base 910 is 9.95 mm between the top edge 901 and bottom edge 902 at the stops 912 and 8.05 mm at a point between the barbs 914. The indent 962 is 0.5×3 mm. Between the contact point 934 and support 940 is 3.751 mm. Between the end of the soldertail 970 and the contact point 934 is 23.489 mm. The tip leading edge 932 is at 35°.

FIGS. 19A–D illustrate detailed features of the strain relief bottom 804. As described above with respect to FIGS. 12–13, the strain relief bottom 804 is heat staked to the insulator 802 (FIG. 13) and replacement flexible circuit 808 (FIG. 13) and snaps together with the strain relief top 806 (FIG. 13) as a strain relief to the solder joints connecting the contact soldertails 970 (FIG. 12) to the flexible circuit solder pads 809 (FIG. 12). The bottom 804 is a generally rectangular, planar piece having a top face 861, bottom face 862, side edges 865, front edge 866, back edge 867 and heat stake holes 868. The bottom face 862 is generally flat. The top face 861 has raised portions 870 extending from the back edge 867 and along each side edge 865. The raised portions 870 define indents 872 proximate the front edge 866 and sockets 874 proximate the back edge 867. Posts 877 extend perpendicularly to the top face 861 from each side edge 865. In the interior of each socket 874 is a catch 875.

In a particular embodiment, the strain relief bottom 804 is generally 23.2×74.5×1.5 mm. Along the front edge 866 to the posts 877, the width is 68 mm. The raised portions 870 are 3 mm thick. The posts 877 are 5 mm in height and 16.2 mm from the back edge 867. The heat stake holes 868 are 2.9 mm in diameter and spaced 27.5 mm apart and 5 mm from the front edge 866. The sockets 874 are 5×2.5×3 mm. The catches 875 extend 0.75 mm from the inside walls of the sockets 874 at a 35° angle.

FIGS. 20A–D illustrate detailed features of the strain relief top 806. As described above with respect to FIGS. 12–13, the strain relief top 806 slides onto the insulator tongues 824 (FIG. 13) and snaps onto the strain relief bottom 804 (FIG. 13) to provide strain relief to the solder joints connecting the contact soldertails 970 (FIG. 12) to the flexible circuit solder pads 809 (FIG. 12). The top 806 also covers, insulates and protects the contacts 900 (FIG. 12) and solder pads 809 (FIG. 12). The top 806 has a front plate 880 and a bottom plate 890 that are generally perpendicular to each other. An angular section 892 joins the front plate 880 and bottom plate 890. The front plate 880 has a front face 888. The bottom plate 890 has a bottom face 894 and a clamp 896 that is a raised portion of the bottom face 894. Side walls 882 extend generally perpendicularly from the ends of the front plate 880. Corners 884 extend generally perpendicularly and inwardly from each side wall 882. The front face 888, side walls 882 and corners 884 form or define grooves 886. Tabs 898, each with a latch end 899, extend generally perpendicularly and downwardly from the bottom face 894.

In a particular embodiment, the strain relief top 806 is generally 16×74.5×10.7 mm, excluding the tabs 898 and the clamp 896. The angular section 892 is at 450° to the front 880 and bottom 890 plates. The tabs 898 extend 3 mm from the bottom face 894, are 4.25 mm across and each have a 45° catch. There is 67.65 mm between the tabs 898. The bottom plate 890 is 3.05 mm thick along the clamp portion 896. The clamp 896 is 2.65 mm×62.3 mm and beveled 45° proximate the front plate 880. The front plate 880 is 2.2 mm thick. The side walls 882 extend 8 mm from the back of the front plate 880. There is 68.3 mm between the ends of the corners 884, which are 2.35 mm across.

The flexible circuit service connector has been disclosed in connection with various embodiments of the present invention and in connection with cutting a faulty device from a flexible circuit and splicing a replacement device to the flexible circuit. Other applications of the present invention include, for example, upgrading portions of a flexible circuit assembly, bypassing portions of a flexible circuit assembly, and cutting and splicing a FFC to a desired length. One of ordinary skill in the art will appreciate many variations and modifications of the disclosed embodiments and various applications within the scope of this invention.

What is claimed is:

1. A service connector comprising:
   a flexible circuit having a thin layer of conductive material;
   a service segment of said flexible circuit wherein said conductive material is patterned as a plurality of contact pads, said service segment dividing said flexible circuit into a removable portion and a remaining portion, said flexible circuit being severable within said service segment so as to detach said removable portion and create a severed end terminating said remaining portion, wherein at least a portion of each of said contact pads is located on said remaining portion proximate said severed end;
   a slider attachable to said service segment, said slider configured to support said severed end and said contact pads after said removable portion is detached;
   an insulator defining a socket, said socket configured for insertion of said slider; and
   a plurality of contacts installed within said socket and connectable to a replacement circuit, each of said contacts connecting to a corresponding one of said contact pads when said slider is inserted into said socket.

2. The service connector of claim 1 further comprising a straightedge portion of said slider positioned across the width of said flexible circuit when said slider is attached to said service segment so as to provide a guide for severing said flexible circuit.

3. The service connector of claim 1 wherein said slider is configured to removably clamp onto said flexible circuit within said service segment.

4. The service connector of claim 1 wherein said service segment defines an edge notch and said slider has a key portion configured to engage said notch only when said slider is mounted to said service segment with a predetermined orientation.

5. The service connector of claim 1 further comprising a cut zone within said service segment, said contacts being connectable to said contact pads if said flexible circuit is cut anywhere within said cut zone.

6. The service connector of claim 5 wherein said cut zone is at least 10 mm in length.

7. The service connector of claim 1 wherein said insulator removably latches to said slider.

8. The service connector of claim 7 wherein said insulator has a tab that retains the attachment of said slider to said service segment when said insulator is latched to said slider.

9. A method of cutting off a removable portion of a flexible circuit and splicing a replacement circuit to a remaining portion of said flexible circuit comprising the steps of:
   providing a service segment between said removable portion and said remaining portion, said remaining portion having a plurality of contact pads;
   attaching a support to said remaining portion within said service segment;
   severing said flexible circuit within said service segment so as to detach said removable portion from said remaining portion;
   installing a plurality of contacts within an insulator;
   electrically connecting said plurality of contacts to said replacement circuit; and
   mating said support to said insulator so as to provide electrical connection between each of said contacts and a corresponding one of said contact pads.

10. The method of claim 9 further comprising the step of defining a cut zone within said service segment, said severing step occurring within said cut zone.

11. The method of claim 9 further comprising the step of positioning a straightedge within said service segment to guide the performance of said severing step.

12. The method of claim 9 further comprising the step of forming a splice plug.

13. The method of claim 9 wherein said attaching step comprises the substep of removably clamping said flexible circuit between a slider and a lock.

14. The method of claim 9 wherein said connecting step comprises the substep of soldering each of said contacts to a corresponding one of a plurality of solder pads.

15. The method of claim 9 wherein said mating step comprises the substep of plugging the severed end of said remaining portion into a socket portion of said insulator.

16. The method of claim 9 further comprising the step of removably locking said support to said insulator.

17. A service connector assembly severing a flexible circuit so as to detach a removable portion of said flexible circuit from a remaining portion of said flexible circuit and creating a splice between a replacement circuit and a severed end of said remaining portion, said assembly comprising:

- a service segment means for providing a plurality of contact pads on said remaining portion wherein, said flexible circuit being severable within service segment means;
- a splice plug means for supporting said severed end and said contact pads, said splice plug means attachable to said service segment means;
- a socket means for engaging said splice plug means;
- a contact means installed within said socket means for providing electrical connection to said contact pads when said splice plug means engages said socket means, said contact means connectable to said replacement circuit so as to provide electrical communications between said replacement circuit and said remaining portion when said splice plug engages said socket means, completing said splice.

18. The service connector assembly of claim 17 wherein said service segment means comprises a notch means for aligning and retaining said splice plug means onto said service segment means.

19. The service connector assembly of claim 17 wherein said splice plug means comprises:
- a slider means for providing a shelf proximate said contact pads; and
- a lock means for securing said slider means to said service segment.

20. The service connector assembly of claim 17 further comprising a clamp means for providing strain relief when said contact means are attached to said replacement circuit, said clamp means attachable to said socket means.

* * * * *